(12) United States Patent
Goto et al.

(10) Patent No.: US 6,344,424 B1
(45) Date of Patent: Feb. 5, 2002

(54) LOW MELTING POINT GLASS, INSULATING PACKAGE, AND SEALING MEMBER

(75) Inventors: Yoshihiro Goto; Eigo Kishi; Katuya Terai; Yoshinobu Natsuhara, all of Shiga (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/571,664

(22) Filed: May 15, 2000

(30) Foreign Application Priority Data

| May 14, 1999 | (JP) | 11-133959 |
| May 26, 1999 | (JP) | 11-146043 |
| May 28, 1999 | (JP) | 11-148975 |
| Nov. 30, 1999 | (JP) | 11-339835 |

(51) Int. Cl.$^7$ ................................................ C03C 8/18
(52) U.S. Cl. ............................. 501/19; 501/63; 501/13; 501/15
(58) Field of Search ............................. 501/45, 46, 47, 501/48, 63, 13, 15, 19

(56) References Cited

U.S. PATENT DOCUMENTS 3,930,873 A * 1/1976 Kaes et al.
4,743,302 A * 5/1988 Dumesnil et al.
6,120,975 A * 9/2000 Tokai et al.

* cited by examiner

*Primary Examiner*—Tom Dunn
*Assistant Examiner*—Colleen P. Cooke
(74) *Attorney, Agent, or Firm*—McGinn & Gibb, PLLC

(57) ABSTRACT

An insulating package is provided with an insulating base having a bottom plate and frame body, electrodes led from the inside to the outside of the insulating base, and a metal cap to seal the frame body. The metal cap is adhered to the frame body by low melting point glass. This low melting point glass contains at least one selected from a group consisting of Al, Ni, Ag, $BaTiO_3$, NiCr, TiB, and $TiO_2$, and inside the glass, spherical particles with diameters of 10 $\mu$m or more are dispersed.

13 Claims, 16 Drawing Sheets

LOW MELTING POINT GLASS, INSULATING PACKAGE, AND SEALING MEMBER

BACKGROUND OF THE INVENTION

1. Field of the Invention

The present invention relates to low melting point glass, an insulating package, and a sealing member which are preferable for quartz oscillators, more specifically, low melting point glass, an insulating package, and a sealing member for secure sealing.

2. Description of the Related Art

In accordance with the recent tendency of compactness, weight reduction, and surface mounting of electronic parts, also in the quartz oscillators, the cylindrical metal package has been changed to a ceramic package. A typical type thereof shall be described below.

FIG. 1A through FIG. 1C show a conventional surface mounting type quartz oscillator G, wherein FIG. 1A is a plan view partially cut and opened, FIG. 1B is a longitudinal section along the centerline in the length direction, and FIG. 1C is a lower view.

In the conventional surface mounting type oscillator G, bottom plate 101 and frame body 102, which are made of ceramic, are formed and united to comprise insulating base 115. The bottom plate 101 has the shape of a plate. The shape of the frame body 102 has the shape of a frame.

At the upper surface of one end in the length direction of the bottom plate 101, as shown in FIG. 1A, an Ag/Pb paste is applied and sintered, whereby Ag/Pb electrodes 103 and 104 are formed. The Ag/Pb electrode 103 is led to the outside from one end in the length direction of the bottom plate 101 by passing between the bottom plate 101 and frame body 102 as shown in FIG. 1B. The other Ag/Pb electrode 104 is, as shown in FIG. 1B, led to the outside from the other end of the bottom plate 101 by making a detour below the frame body 102. Also, at both ends in the length direction of the lower surface of the bottom plate 101, Ag/Pb terminals 105 and 106 are formed. The Ag/Pb electrodes 103 and 104 are connected to the Ag/Pb terminals 105 and 106 through the end face of the bottom plate 101, respectively. On the Ag/Pb electrodes 103 and 104 and Ag/Pb terminals 105 and 106, electroless Ni plating layer and/or electroless Au plating layer are formed although it is not shown.

On the Ag/Pb electrodes 103 and 104, quartz oscillating piece 108 having electrodes (not shown) on both surfaces are adhered by an electric conductive adhesive, and the Ag/Pb electrodes 103 and 104 and quartz oscillating piece 108 are connected to each other.

Also, near the end portion of the opposite side of the Ag/Pb electrodes 103 and 104 at the upper surface of the bottom plate 101, support 107 for supporting the quartz oscillating piece 108 in a horizontal condition is formed. The support 107 is called "pillow" in some cases.

On the frame body 102, ceramic-made cap 110 is adhered via low melting point glass 109. Thereby, the inside of the insulating package is sealed.

However, the surface mounting type quartz oscillator G has a serious problem in that, since the bottom plate 101, frame body 102, and cap 110 are formed from ceramic, due to a difference in the thermal expansion coefficient from quartz oscillating piece 108, stresses are added to the quartz oscillating piece 108, whereby the vibration characteristics are changed.

Also, if the cap 110 made of ceramic is used, in view of the mechanical strength, there is a limit to make the vibrator thinner. Therefore, there are also limits to making the entire quartz oscillator G smaller in height.

Therefore, the present applicant proposed that the insulating base was made of a glass ceramic compound, and in place of the ceramic-made cap, a metal cap made of stainless steel was used. FIG. 2A through FIG. 2C show a conventional surface mounting type quartz oscillator H, wherein FIG. 2A is a plan view partially cut and opened, FIG. 2B is a longitudinal section along the centerline in the length direction, and FIG. 2C is a lower view.

In the conventional surface mounting type quartz oscillator H, bottom plate 121 and frame body 122 which are made of a glass ceramic compound are formed and united to comprise insulating base 135. Also, on the frame body 122, via low melting point glass 109, metal cap 130 made of stainless steel is adhered. The other structure is the same as in that of the surface mounting type quartz oscillator G.

The glass ceramic compound is formed by dispersing fine powder of forsterite of 30 through 70 wt % in alkali glass, and its thermal expansion coefficient is $100 \times 10^{-7}$ through $150 \times 10^{-7}$ (/° C.). By using such glass ceramic, the difference in the thermal expansion coefficient between the quartz oscillating piece and metal cap is eliminated or remarkably reduced. Therefore, the change in characteristics of the quartz oscillating piece and separation of the metal cap due to the stress caused by the difference in the thermal expansion coefficient can be prevented.

However, when such a quartz oscillator was stored at a high temperature and in high humidity, a phenomenon in that separation occurred between the frame body and low melting point glass was shown.

SUMMARY OF THE INVENTION

The object of the invention is to provide low melting point glass, an insulating package, and a sealing member whereby secure sealing can be made between an insulating base and a cap.

According to one aspect of the present invention, low melting point glass contains at least one kind selected from a group consisting of Al, Ni, Ag, $BaTiO_3$, NiCr, TiB, and $TiO_2$.

The inventors thoroughly researched the cause for the abovementioned phenomenon, and as a result, they found that the alkali glass composing the glass ceramic caused elution of the phosphoric acid composing the low melting point glass, and the composition of the low melting point glass changed and its sealing performance was lost, whereby separation occurred. Also, they thoroughly researched a method for preventing such a phenomenon, and as a result, they found that, by adding certain kinds of additives to the low melting point glass, the phenomenon could be prevented.

The abovementioned low melting point glass has an action whereby elution of phosphoric acid from the low melting point glass due to the alkali glass ingredients in the glass ceramic is suppressed or prevented by the additive, and the low melting point glass can be directly sealed with the glass ceramic.

According to a second aspect of the present invention, a glass ceramic sealing member comprises a base member made of a glass ceramic compound, and low melting point glass to be used to seal the base member. The low melting point glass contains at least one kind of substance selected from a group consisting of Al, Ni, Ag, $BaTiO_3$, NiCr, TiB, and $TiO_2$.

In this aspect of the invention, elution of phosphoric acid in the low melting point glass due to the alkali glass ingredients in the glass ceramic is suppressed or prevented by the additive in the low melting point glass, whereby the glass ceramic sealing member can be increased in airtightness.

According to a third aspect of the present invention, a sealing member comprises a base member made of ceramic, low melting point glass to be used to seal the base member, and a buffer layer interposed between the base member and the low melting point glass.

In the aspect of the invention, by a buffer layer interposed between the ceramic and low melting point glass, mutual interference under storage at a high temperature and in high humidity is prevented, elution of phosphoric acid in the low melting point glass due to the alkali ingredients in the ceramic does not occur, and lowering in peel-strength at the sealing interfaces can be prevented, whereby separation does not occur.

According to a fourth aspect of the present invention, an insulating package comprises an insulating base having a bottom plate and frame body, electrodes led out from the inside to the outside of the insulating base, a metal cap which seals the frame body, and low melting point glass to adhere said metal cap to the frame body. The low melting point glass has spherical particles with diameters of 10 μm or more dispersed inside.

In the aspect of the invention, due to spherical particles dispersed in the low melting point glass, the dimension of the space between the upper surface of the frame body and lower surface of the cap is easily and securely restricted, and inclination of the metal cap is prevented, whereby the package can be reduced in height more than in the prior-art.

According to a fifth aspect of the present invention, an insulating package comprises an insulating base having a bottom plate and frame body, electrodes led from the inside to the outside of the insulating base, a conductive cap which seals the frame body. The conductive cap has a cap core and a conductive film which is formed at least at the lower surface of the cap core and has resistance lower than that of the cap core.

In the aspect of the invention, by an electric conductive film and electric conductive sealing material formed at least at the lower surface of the electric conductive cap body, the electric conductive cap can be grounded at low resistance.

According to a sixth aspect of the present invention, an electronic element sealing member comprises an insulating package as set forth in claim 26, and a quartz oscillating piece or piezoelectric material element sealed within the insulating package as an electronic element.

In the aspect of the invention, the characteristics of the quartz oscillating piece or piezoelectric material element housed in the structure do not change due to the floating capacity and external electromagnetic waves.

BRIEF DESCRIPTION OF THE DRAWINGS

FIG. 1A through FIG. 1C show the conventional surface mounting type quartz oscillator G, wherein FIG. 1A is a plan view partially cut and opened, FIG. 1B is a longitudinal section along the centerline in the length direction, and FIG. 1C is a lower view.

FIG. 2A through FIG. 2C show the conventional surface mounting type quartz oscillator H, wherein FIG. 2A is a plan view partially cut and opened, FIG. 2B is a longitudinal section along the centerline in the length direction, and FIG. 2C is a lower view.

FIG. 3A through FIG. 3C show the surface mounting type quartz oscillator A as an example of the glass ceramic sealing member using low melting point glass relating to the first embodiment of the invention, wherein FIG. 3A is a plan view partially cut and opened so as to show the internal structure, FIG. 3B is a schematic section along the center line in the length direction, and FIG. 3C is a lower view.

FIG. 6A through FIG. 6C show the surface mounting type quartz oscillator B relating to the second embodiment of the invention, wherein FIG. 6A is a plan view partially cut and opened so as to show the internal structure, FIG. 6B is a schematic section along the center line in the length direction, and FIG. 6C is a lower view.

FIG. 10A through FIG. 10C show the surface mounting type quartz oscillator C relating to the third embodiment of the invention, wherein FIG. 10A is a plan view partially cut and opened so as to show the internal structure, FIG. 10B is a schematic section along the center line in the length direction which partially includes a front view, and FIG. 10C is a lower view.

FIG. 11 is a sectional view showing the spherical particles 31a.

FIG. 14A through FIG. 14C show the surface mounting type quartz oscillator D relating to the fourth embodiment of the invention, wherein FIG. 14A is a plan view partially cut and opened so as to show the internal structure, FIG. 14B is a schematic section along the center line in the length direction which partially includes a front view, and FIG. 14C is a lower view.

FIG. 15A through FIG. 15C show the surface mounting type quartz oscillator E relating to the fifth embodiment of the invention, wherein FIG. 15A is a plan view partially cut and opened so as to show the internal structure, FIG. 15B is a schematic section along the center line in the length direction which partially includes a front view, FIG. 15C is a lower view.

FIG. 17A through FIG. 17C show the surface mounting type quartz oscillator F relating to the sixth embodiment of the invention, wherein FIG. 17A is a plan view partially cut and opened so as to show the internal structure, FIG. 17B is a schematic section along the center line in the length direction which partially includes a front view, and FIG. 17C is a lower view.

DETAILED DESCRIPTION OF THE PREFERRED EMBODIMENTS

Hereinafter, the embodiments of the invention shall be described in detail with reference to the attached drawings.

Figure 1A:
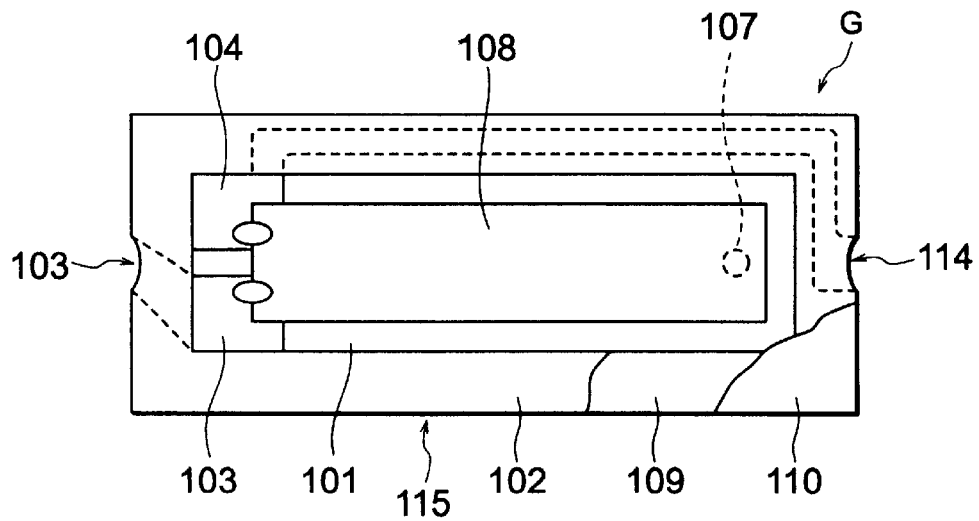
Figure 1B:
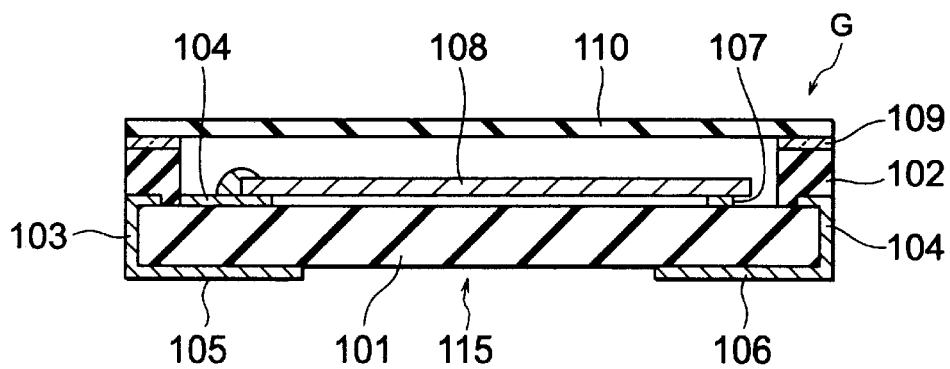
Figure 1C:
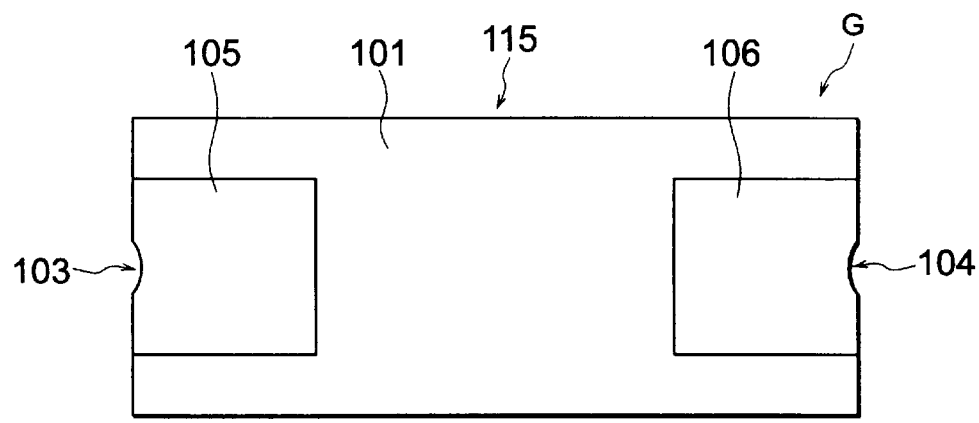
Figure 2A:
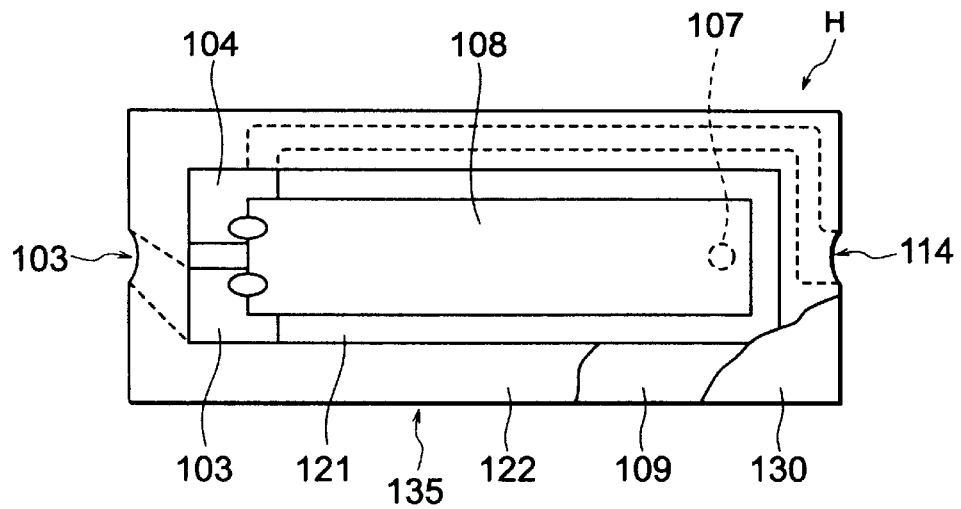
Figure 2B:
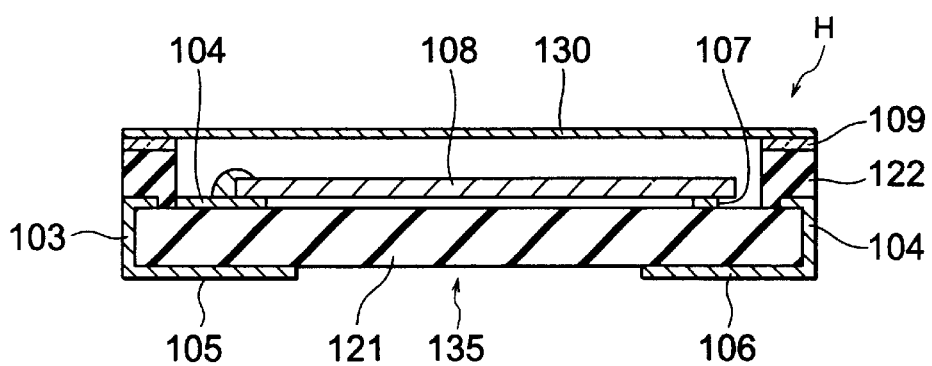
Figure 2C:
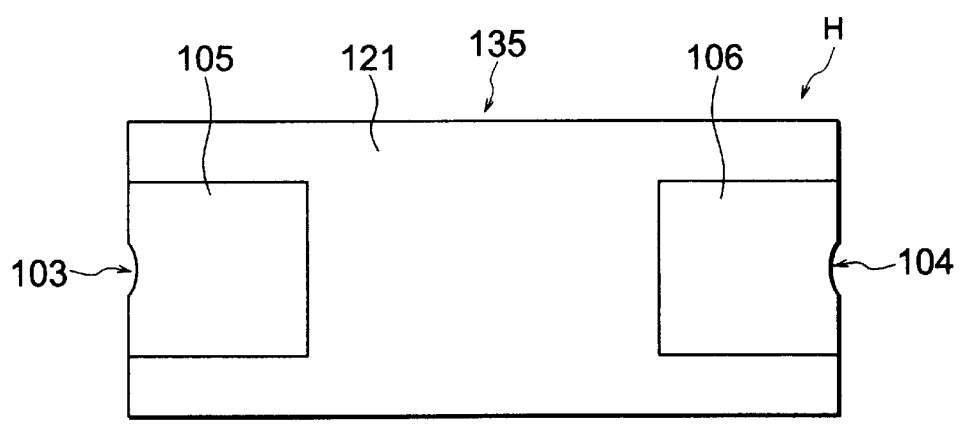
Figure 3A:
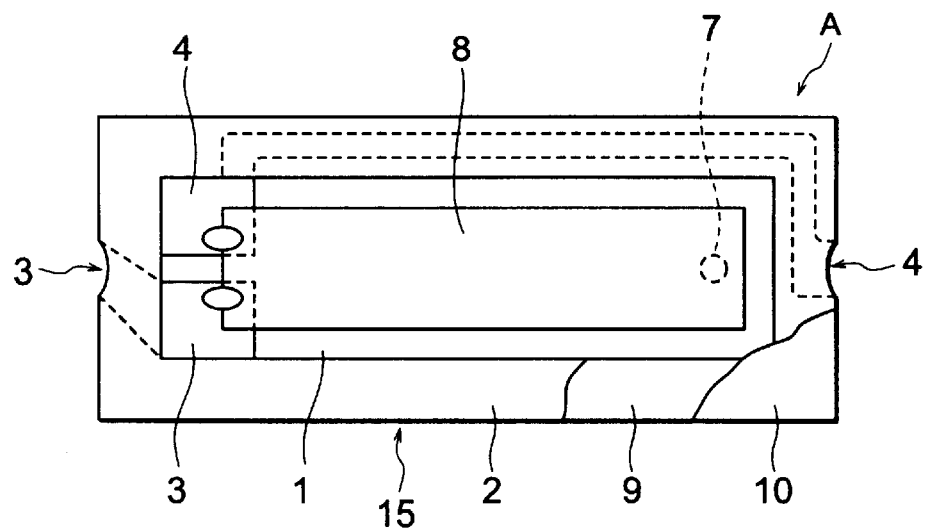
Figure 3B:
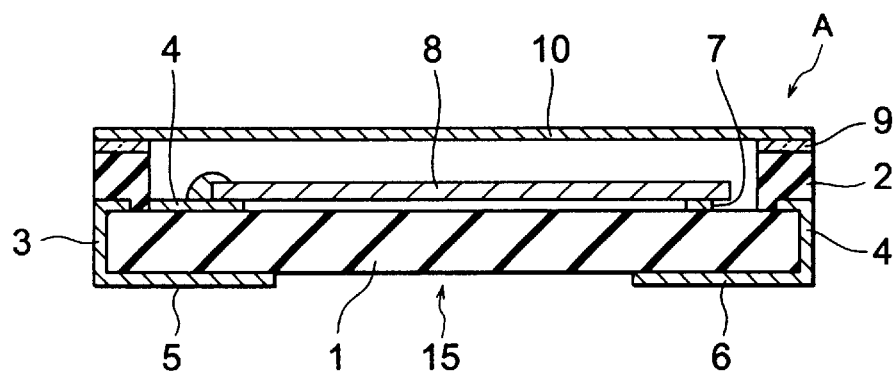
Figure 3C:
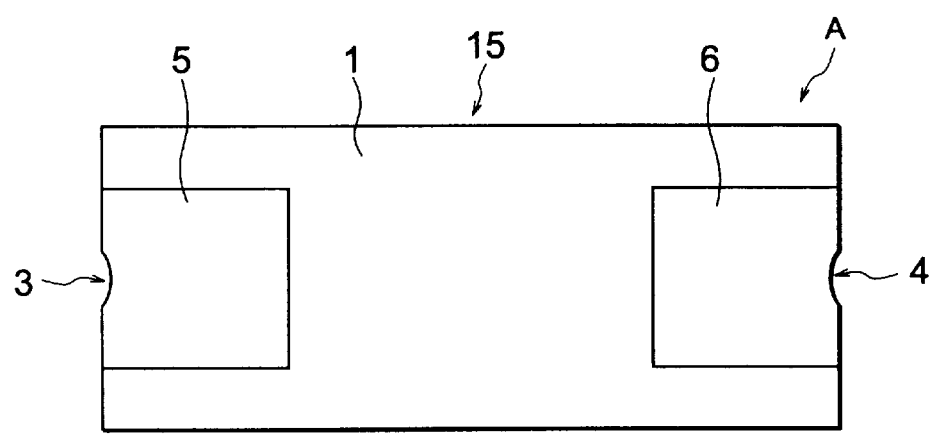

FIG. 3A through FIG. 3C show a surface mounting type quartz oscillator A as an example of the glass ceramic sealing member using low melting point glass relating to the first embodiment of the invention, wherein FIG. 3A is a plan view partially cut and opened so as to show the internal structure, FIG. 3B is a schematic section along the center line in the length direction, and FIG. 3C is a lower view.

In the first embodiment, bottom plate 1 and frame body 2, which are made of a glass ceramic compound, are formed and united to comprise insulating base 15. The bottom plate 1 has the shape of a plate. The dimensions of the bottom plate 1 are as follows, for example. The dimension in the length direction is 3.0 through 12.0 mm, the dimension in the width direction is 2.0 through 10.0 mm, and the thickness is 0.2 through 1.0 mm. The frame body 2 has the shape of a frame. The dimensions of the frame body 2 are as follows, for example. The inside dimension in the length direction is 2.0 through 11.0 mm, and the inside dimension in the width direction is 1.0 through 9.0 mm, and the thickness is 0.2 through 1.0 mm. The bottom plate 1 and frame body 2 are formed in a way, for example, so that fine powder 30 through 70 wt % of forsterite with particle diameters of approximately 0.3 through 3 $\mu$m is dispersed in alkali glass powder with particle diameters of 0.3 through 3 $\mu$m, molded, and sintered. The thermal expansion coefficients of the bottom plate 1 and frame body 2 are, for example, $100 \times 10^{-7}$ to $150 \times 10^{-7}$ (/° C.).

The alkali fine powder composing the glass ceramic compound of the bottom plate 1 and frame body 2 in the first embodiment has the following composition, for example, and contains alkali ingredients such as $Na_2O$, $K_2O$, and $LiO_2$. This is referred to as first composition.

$SiO_2$: 50 to 70 (wt %)

$Al_2O_3$: 2 to 15 (wt %)

RO: 5 to 30 (wt %) (R contains one or more among Ca, Sr, and Ba)

$B_2O_3$: 1 to 8 (wt %)

ZnO: 2 to 15 (wt %)

$R'_2O$: 5 to 30 wt % (R' contains one or more among Na, K, and Li)

On the upper surface of one end portion in the length direction of the bottom plate 1, as shown in FIG. 3A, an Ag/Pb paste is applied and sintered, whereby Ag/Pb electrodes 3 and 4 are formed. The thickness of the Ag/Pb electrodes 3 and 4 are approximately 40 through 50 $\mu$m, for example. The Ag/Pb electrode 3 is, as shown in FIG. 3B, let to the outside of one end in the length direction of the bottom plate 1 by passing between the bottom plate 1 and frame body 2. The other Ag/Pb electrode 4 is, as shown in FIG. 3B, led to the outside of the other end of the bottom plate 1 by making a detour below the frame body 2. Also, at both ends in the length direction of the lower surface of the bottom plate 1, Ag/Pb terminals 5 and 6 are formed. The Ag/Pb electrodes 3 and 4 pass the end face of the bottom plate 1 and are connected to the Ag/Pb terminals 5 and 6. Ag/Pb electrodes 3 and 4 and Ag/Pb terminals 5 and 6 can be separately formed, however, they can be simultaneously formed. On the Ag/Pb electrodes 3 and 4 and Ag/Pb terminals 5 and 6, electroless Ni plating layers and/or electroless Au plating layers are formed although they are not shown.

On the Ag/Pb electrodes 3 and 4, quartz oscillating piece 8 having electrodes (not shown) on both surfaces is adhered by a conductive adhesive, and the Ag/Pb electrodes 3 and 4 and the quartz oscillating piece 8 are connected to each other.

On the Ag/Pb electrodes 3 and 4 at the upper surface of the bottom plate 1 and near the opposite end portion, supporting part 7 for supporting the quartz oscillating piece 8 in a horizontal condition is formed. The supporting part 7 is formed from the same material as that of the Ag/Pb electrodes 3 and 4 so as to also have the same thickness. The supporting part 7 is called a "pillow" in some cases. Also, since the supporting part 7 is provided for supporting the quartz oscillating piece 8 in a horizontal condition, it is not necessary to adhere the quartz oscillating piece 8 to the supporting part.

On the frame body 2, via low melting point glass 9, metal cap 10 made of stainless steel is adhered. Thereby, the inside of the insulating package is sealed. The thickness of the low melting point glass 9 is, for example, approximately 0.05 through 0.2 mm.

Next, composition of the low melting point glass 9 of the invention shall be described.

The base member of the low melting point glass 9 is silver-phosphoric acid-based glass added with fillers described below.

To silver-phosphoric acid-based glass of 30 through 70 wt % made of Ag-P-I-O, a phosphoric acid compound or niobium pentoxide of 70 through 30 wt % is added as fillers. The softening point of the silver-phosphoric acid-based glass is approximately 200 through 230° C. By adding the filler, the thermal expansion coefficient is equal or close to that of the glass ceramic compound. Also, the silver-phosphoric acid-based glass is formed by being mixed with $Ag_2O$, AgI, and $P_2O_5$, then melted, and ground. As a result, as the percentages of Ag, P, and I, Ag is 30 through 60 atomic weight %, P is 20 through 40 atomic weight %, and I is 5 through 15 atomic weight %. Also, the operating temperature is approximately 270 through 290° C.

Furthermore, to the silver-phosphoric acid-based glass added with the filler, one or more selected among the group of Al, Ni, Ag, $BaTiO_3$, NiCr, TiB, and $TiO_2$ are added by 0.1 through 10 vol %.

Herein, if the added amount of the selected one or more among the group of Al, Ni, Ag, $BaTiO_3$, NiCr, TiB, and $TiO_2$ is less than 0.1 vol %, an effect for improving the sealing strength cannot be obtained in the test at a high temperature and in high humidity. On the other hand, if it exceeds 10 vol %, the operating temperature of the low melting point glass 9 rises and the glass becomes difficult to flow, whereby sealing at a low temperature becomes difficult. Therefore, the desirable amount to be added of the selected one or more among the group of Al, Ni, Ag, $BaTiO_3$, NiCr, TiB, and $TiO_2$ is 0.1 through 10 vol %.

Next, the results of sealing strength test in the glass ceramic sealing member using the low melting point glass relating to the invention shall be described in comparison with the results of the sealing strength test in the glass ceramic sealing member using the conventional low melting point glass.

Figure 4:
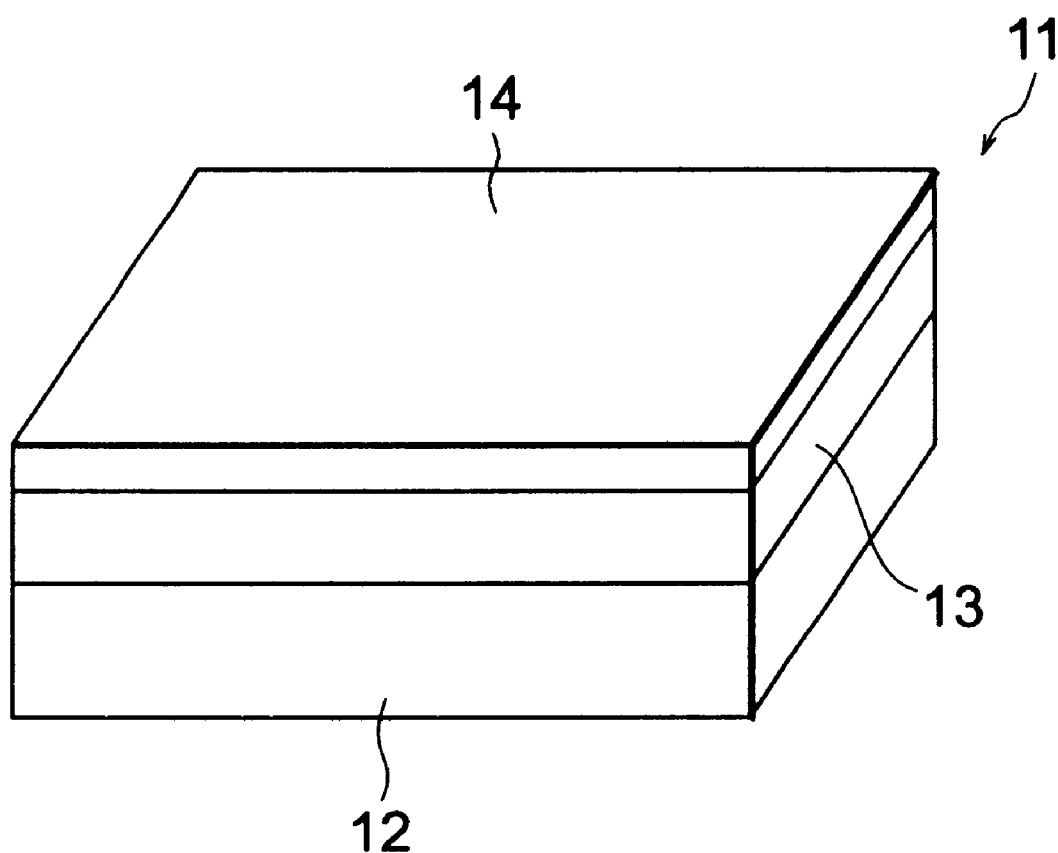
FIG. 4 is a perspective view showing the test piece in the first embodiment.

The actual test was conducted for test piece 11 which was formed so that, to glass ceramic compound piece 12, stainless steel piece 14 having the same dimensions as that of the glass ceramic piece 12 and a thickness of 0.1 mm was adhered via low melting point glass 13 with a thickness of 0.1 mm as shown in FIG. 4. The dimensions of the glass ceramic piece 12 are as follows:

Length: 5.0 (mm)

Width: 3.2 (mm)

Thickness: 0.6 (mm)

The sealing strength test was conducted by measuring peel-strength after the test piece 11 was left in an airtight container maintained at a high pressure and high temperature, that is, after a severe pressure cooker test (PCT). PCT's temperature is 121° C. and it's relative humidity is 96%.

Figure 5A:
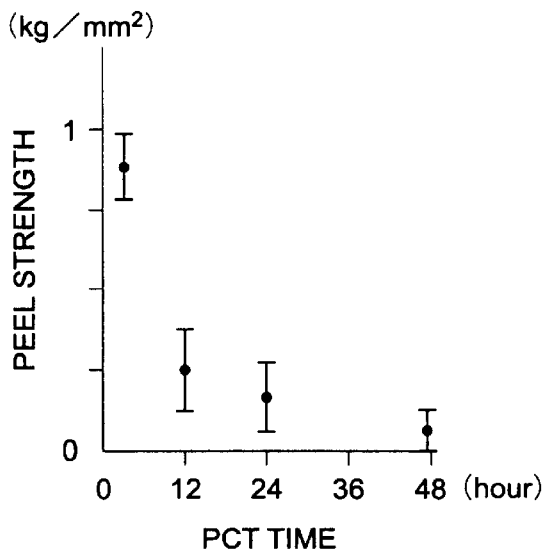
FIG. 5A through FIG. 5C are graphs showing the results of the pressure cooker test.
Figure 5B:
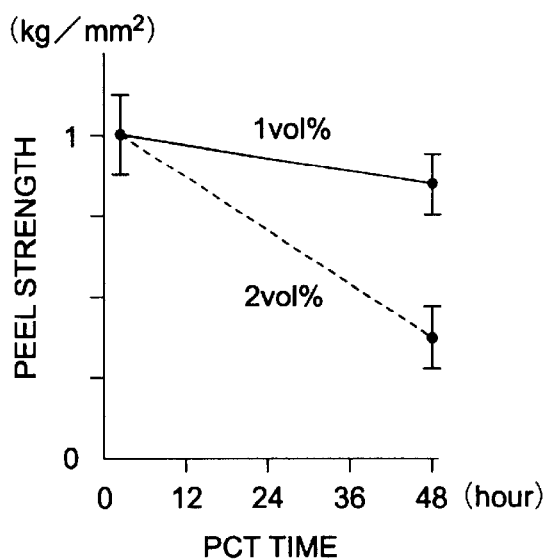
Figure 5C:
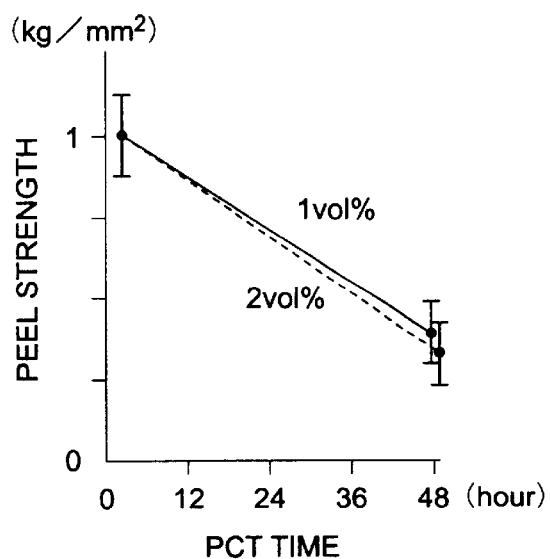

The results of this test are shown in Table 1 to Table 3 and FIG. 5A through FIG. 5C. Table 1 and 2 show the results when a simple additive was added, and Table 3 shows the results when two or more additives were combined and added. Furthermore, FIG. 5A shows the results when no additive was added, FIG. 5B shows the results when Ni was added, and FIG. 5C show the results when Au was added. In FIG. 5A through FIG. 5C, the horizontal axis shows the pressure cooker test (PCT) time (hrs), and the vertical axis shows the peel-strength (kg/mm$^2$).

In the Table 1 to Table 3, a symbol "⊙" represents "excellent", a symbol "○" represents "good", a symbol "X" represents "bad", a symbol "-" represents "no evaluation".

TABLE 1

| Additive | Amount (vol %) | PCT time (Hr) 0 | 12 | 24 | 36 | 48 |
|---|---|---|---|---|---|---|
| Nothing | — | ○ | ○ | X | — | X |
| Ag | 0.05 | X | — | — | — | — |
|  | 0.1 | ○ | ○ | ○ | — | ○ |
|  | 1 | ⊙ | ⊙ | ⊙ | — | ○ |
|  | 5 | ○ | ○ | ○ | — | ○ |
|  | 10 | ○ | ○ | ○ | — | ○ |
|  | 15 | X | — | — | — | — |
| Al | 0.05 | X | — | — | — | — |
|  | 0.1 | ○ | ○ | ○ | — | ○ |
|  | 1 | ⊙ | ⊙ | ⊙ | — | ○ |
|  | 5 | ○ | ○ | ○ | — | ○ |
|  | 10 | ○ | ○ | ○ | — | ○ |
|  | 15 | X | — | — | — | — |
| Ni | 0.05 | X | — | — | — | — |
|  | 0.1 | ○ | ○ | ○ | — | ○ |
|  | 1 | ⊙ | ⊙ | ⊙ | — | ⊙ |
|  | 5 | ○ | ○ | ○ | — | ○ |
|  | 10 | ○ | ○ | ○ | — | ○ |
|  | 15 | X | — | — | — | — |

TABLE 2

| Additive | Amount (vol %) | PCT time (Hr) 0 | 12 | 24 | 36 | 48 |
|---|---|---|---|---|---|---|
| BaTiO$_3$ | 0.05 | X | — | — | — | — |
|  | 0.1 | ○ | ○ | ○ | — | ○ |
|  | 1 | ⊙ | ⊙ | ⊙ | — | ○ |
|  | 5 | ○ | ○ | ○ | — | ○ |
|  | 10 | ○ | ○ | ○ | — | ○ |
|  | 15 | X | — | — | — | — |
| NiCr | 0.05 | X | — | — | — | — |
|  | 0.1 | ○ | ○ | ○ | — | ○ |
|  | 1 | ⊙ | ⊙ | ⊙ | — | ○ |
|  | 5 | ○ | ○ | ○ | — | ○ |
|  | 10 | ○ | ○ | ○ | — | ○ |
|  | 15 | X | — | — | — | — |
| TiB | 0.05 | X | — | — | — | — |
|  | 0.1 | ○ | ○ | ○ | — | ○ |
|  | 1 | ⊙ | ⊙ | ⊙ | — | ○ |
|  | 5 | ○ | ○ | ○ | — | ○ |
|  | 10 | ○ | ○ | ○ | — | ○ |
|  | 15 | X | — | — | — | — |
| TiO$_2$ | 0.05 | X | — | — | — | — |
|  | 0.1 | ○ | ○ | ○ | — | ○ |
|  | 1 | ⊙ | ⊙ | ⊙ | — | ○ |
|  | 5 | ○ | ○ | ○ | — | ○ |
|  | 10 | ○ | ○ | ○ | — | ○ |
|  | 15 | X | — | — | — | — |

TABLE 3

| Additive | Amount (vol %) | PCT time (Hr) 0 | 12 | 24 | 36 | 48 |
|---|---|---|---|---|---|---|
| Nothing | — | ○ | ○ | X | — | X |
| Ag + Al | 0.05 | X | — | — | — | — |
|  | 0.1 | ○ | ○ | ○ | — | ○ |
|  | 1 | ⊙ | ⊙ | ⊙ | — | ○ |
|  | 5 | ○ | ○ | ○ | — | ○ |
|  | 10 | ○ | ○ | ○ | — | ○ |
|  | 15 | X | — | — | — | — |
| Ag + TiO$_2$ | 0.05 | X | — | — | — | — |
|  | 0.1 | ○ | ○ | ○ | — | ○ |
|  | 1 | ⊙ | ⊙ | ⊙ | — | ○ |
|  | 5 | ○ | ○ | ○ | — | ○ |
|  | 10 | ○ | ○ | ○ | — | ○ |
|  | 15 | X | — | — | — | — |
| Al + Ni | 0.05 | X | — | — | — | — |
|  | 0.1 | ○ | ○ | ○ | — | ○ |
|  | 1 | ⊙ | ⊙ | ⊙ | — | ⊙ |
|  | 5 | ○ | ○ | ○ | — | ○ |
|  | 10 | ○ | ○ | ○ | — | ○ |
|  | 15 | X | — | — | — | — |
| TiB + TiO$_2$ | 0.05 | X | — | — | — | — |
|  | 0.1 | ○ | ○ | ○ | — | ○ |
|  | 1 | ⊙ | ⊙ | ⊙ | — | ⊙ |
|  | 5 | ○ | ○ | ○ | — | ○ |
|  | 10 | ○ | ○ | ○ | — | ○ |
|  | 15 | X | — | — | — | — |

From the above test results, it is clearly understood that the low melting point glass relating to the invention has excellent sealing performance for the glass ceramic compound in comparison with the conventional low melting point glass.

Also, at the sealing portion between the low melting point glass 13 and stainless steel piece 14, between the low melting point glass 13 relating to the invention and the conventional low melting point glass without any additive, no particular difference in the sealing performance was found.

In actuality, for the package of a glass ceramic compound in which the cap 10 made of stainless steel was sealed onto the insulating base 15 having the bottom plate 1 and frame body 2 which were made of the glass ceramic compound via the low melting point glass 9, the same test was conducted, and the same results were obtained.

As alkali glass of the glass ceramic compound comprising the bottom plate 1 and frame body 2, in addition to the glass shown in the above embodiment, as for the following glasses having the second composition and third composition, respectively, similar results were obtained.

(Second composition)

SiO$_2$: 40 to 55 (wt %)

Al$_2$O$_3$: 20 to 30 (wt %)

P$_2$O$_5$: 1 to 20 (wt %)

BaO: 0.5 to 5 (wt %)

ZnO: 2 to 15 (wt %)

R'$_2$O: 5 to 10 (wt %) (R': Na, K)

(Third composition)
SiO$_2$: 70 to 85 (wt %)
P$_2$O$_5$: 1 to 5 (wt %)
MgO: 1 to 5 (wt %)
R$_2$O: 8 to 25 (wt %) (R: Li, K)

Also, as for a 1.2 through 5 wt % glass ceramic compound in which fine powder (particle diameter: 0.1–μm) of one or more kinds among ZrO, SnO$_2$, P$_2$O$_5$, and MoO$_3$ was added to the alkali glass having the first composition, similar results were obtained.

Figure 6A:
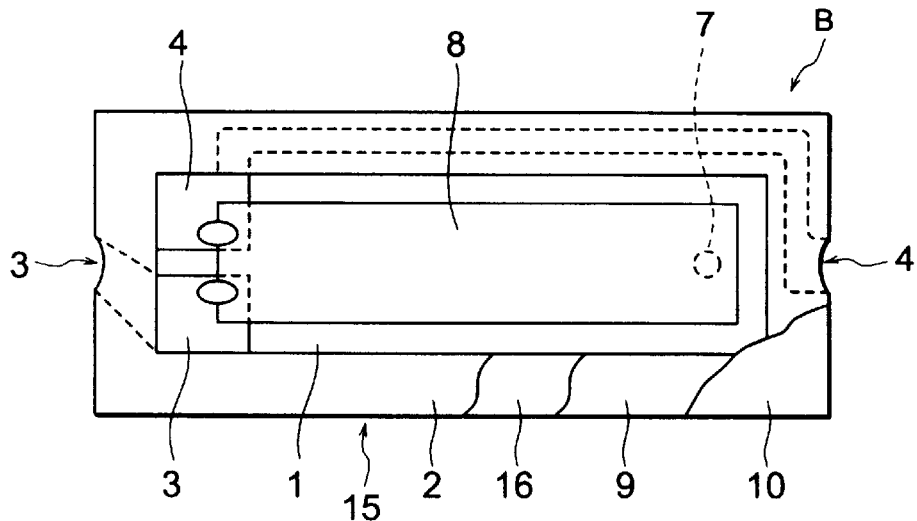
Figure 6B:
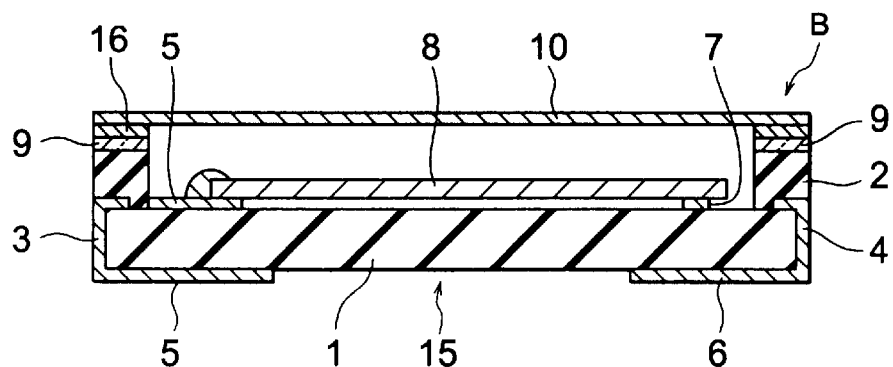
Figure 6C:
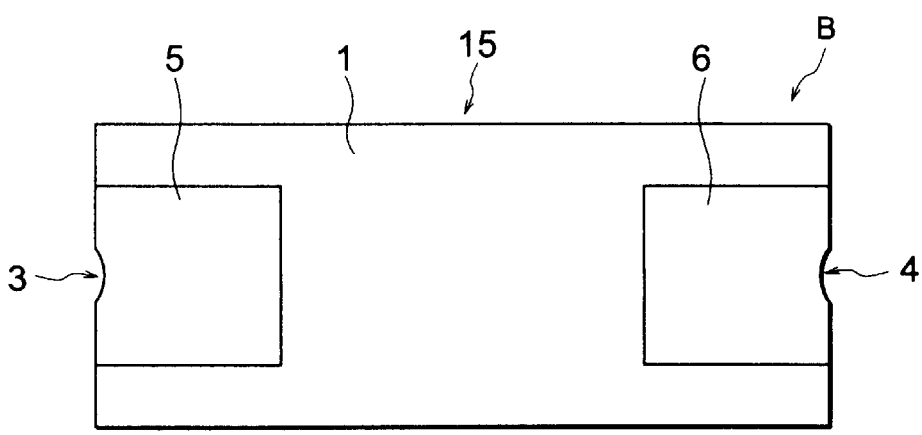

Next, the second embodiment shall be described. FIG. 6A through FIG. 6C show the surface mounting type quartz oscillator B relating to the embodiment of the invention, wherein FIG. 6A is a plan view partially cut and opened so as to show the internal structure, FIG. 6B is a schematic section along the center line in the length direction, and FIG. 6C is a lower view.

In the second embodiment, buffer layer 16 is formed on the entire upper surface of the frame body 3. And, on the buffer layer 16, metal cap 10 made of stainless steel is adhered via the low melting point glass 9. Thereby, the inside of the insulating package is sealed. The thickness of the low melting point glass 9 is, for example, approximately 0.05 through 0.2 mm.

The buffer layer 16 is formed from any of waterproof glass, a metallized layer, and a metal layer. The thickness thereof is, for example, approximately 5 through 50 μm. For the waterproof glass, for example, lead-boric acid-based low melting point glass (PbO—B$_2$O$_3$—based) or glazed glass for covering (MgO—B$_2$O$_3$—SiO$_2$—based) can be used. For the metallized layer, Au and Ni layers can be used. For the metal layer, in the same way for the electrodes 4 and 5 and terminals 6 and 7, an Ag paste and Ag/Pb paste formed by being applied with W paste and Mo paste and sintered can be used. Of course, an electroless Ni plating layer and/or electroless Au plating layer can be formed on the metal layer.

Furthermore, in the second embodiment, as the low melting point glass 9, for example, silver-phosphoric acid-based low melting point glass, in which, to glass ingredients containing silver oxide of 40 through 60 wt %, phosphorus pentoxide of 20 through 30 wt %, and zinc oxide of 1 through 6 wt %, a 10 through 30 wt % solid solution of zirconium oxide and niobium oxide are added as a filler, can be used. The operating temperature thereof is, for example, approximately 260 through 300° C.

Next, the results of the sealing strength test conducted for the sealing member relating to the embodiment in which buffer layer 16 is interposed between the frame body 3 made of a glass ceramic compound and low melting point glass 11 shall be described in comparison with the results of the sealing strength test conducted for the conventional sealing member in which the frame body made of a glass ceramic compound and low melting point glass are directly sealed to each other without interposition of a buffer layer.

Figure 7:
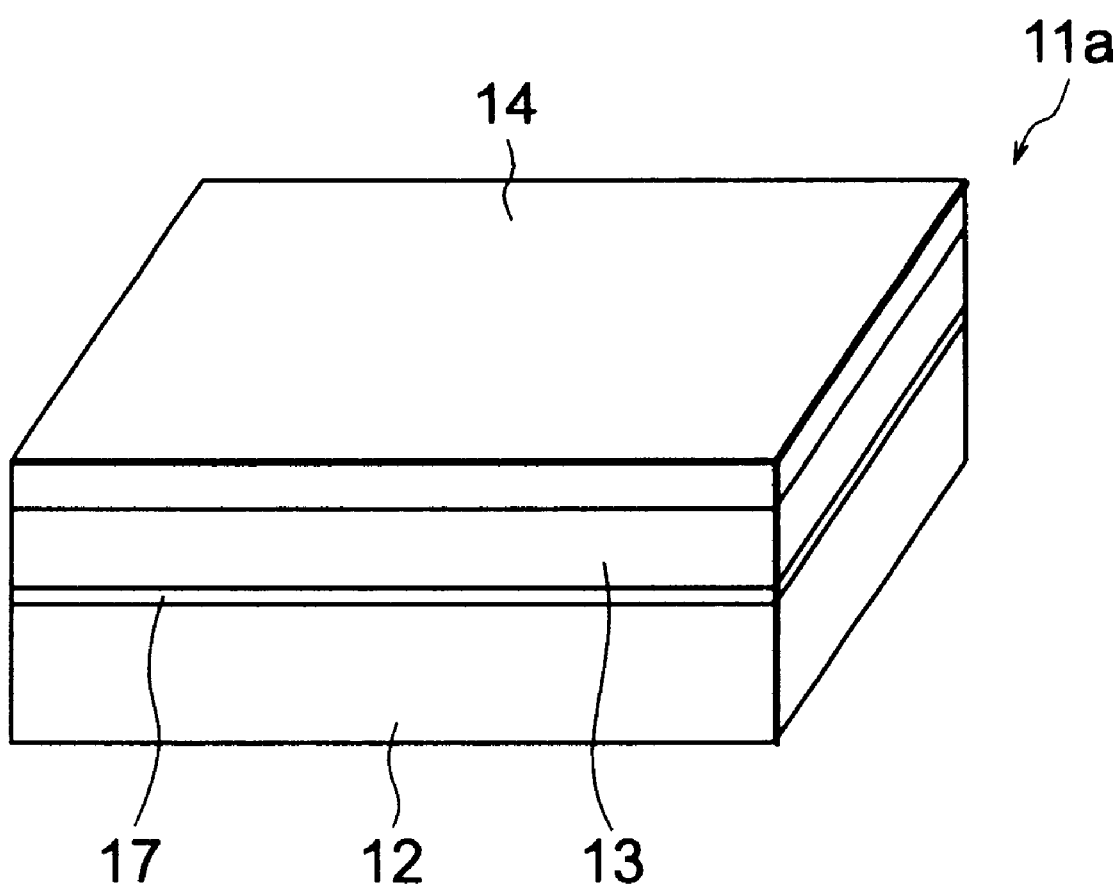
FIG. 7 is a perspective view showing the test piece in the second embodiment.

In actuality, in place of the surface mounting type quartz oscillator B shown in FIG. 6A through FIG. 6C, as shown in FIG. 7, test piece 11a, in which, on glass ceramic compound piece 12, buffer layer 17 with a thickness of 5 through 50 μm was formed, and on the buffer layer, stainless steel piece 14 having the same dimensions as that of the glass ceramic piece 12 and a thickness of 0.1 mm was adhered via low melting point glass 13 with a thickness of 0.1 mm, was subjected to the test.

The sealing strength test was conducted in the same way as in the first embodiment.

Figure 8A:
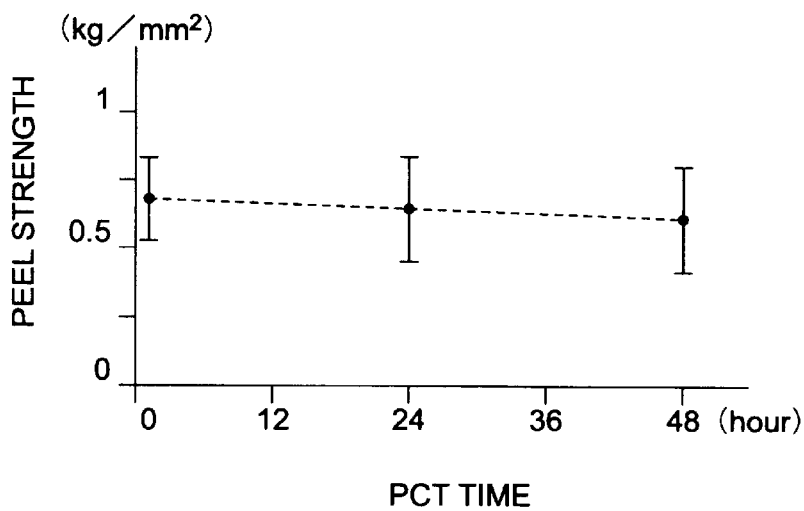
FIG. 8A through FIG. 8C are graphs showing the results of the pressure cooker test in the second embodiment.
Figure 8B:
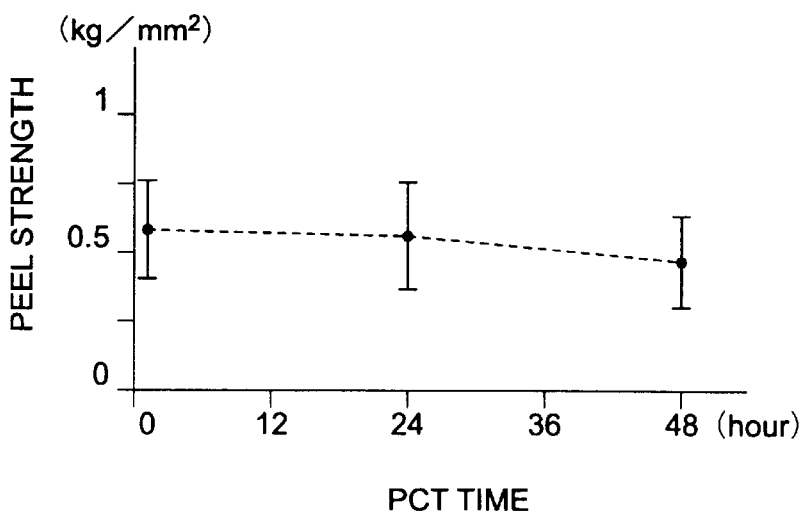
Figure 8C:
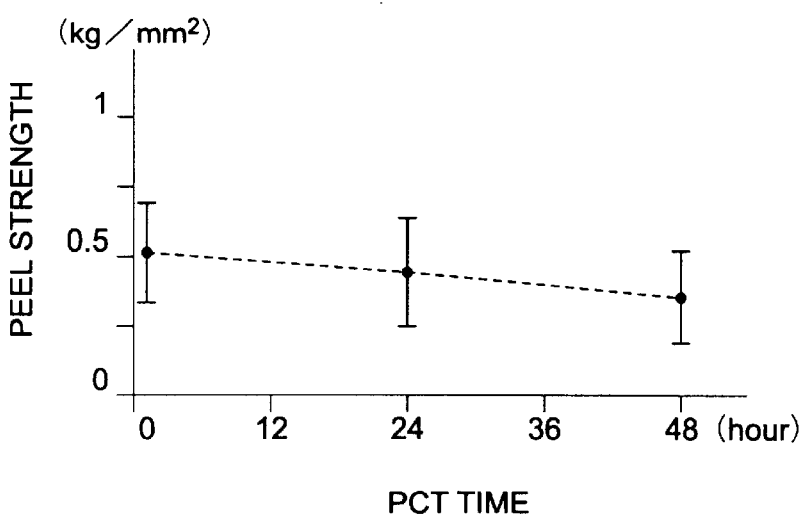

The results of this test are shown in Table 4 and FIG. 8A through FIG. 8C. As the waterproof glass, glazed glass for covering (MgO—B$_2$O$_3$—SiO$_2$—based) was used (FIG. 8A). As the metallized layer, an Au layer was used (FIG. 8B). As the metal layer, an Ag/Pb paste was used (FIG. 8C). As for the thickness, three standard thicknesses were taken.

FIG. 8A shows the results when glazed glass for covering (MgO—B$_2$O$_3$—SiO$_2$—based) having a thickness of 50 μm is used as the waterproof glass. FIG. 8B shows the results when an Au layer with a thickness of 5 μm is used as the metallized layer. FIG. 8C shows the results when an Ag/Pb paste with a thickness of 10 μm is used as the metal layer.

In the Table 4, a symbol "Δ" represents "passable".

TABLE 4

| Buffer Layer | Thickness (μm) | PCT time (Hr) 0 | 12 | 24 | 36 | 48 |
|---|---|---|---|---|---|---|
| Nothing | — | ○ | X | X | — | X |
| MgO—B$_2$O$_3$—SiO$_2$ | 5 | ⊚ | — | ○ | — | Δ |
|  | 10 | ⊚ | — | ⊚ | — | ○ |
|  | 50 | ⊚ | — | ⊚ | — | ○ |
| Au | 5 | ⊚ | — | ⊚ | — | ○ |
|  | 10 | ⊚ | — | ⊚ | — | ○ |
|  | 50 | ⊚ | — | ⊚ | — | ○ |
| Ag/Pd | 5 | ⊚ | — | ○ | — | ○ |
|  | 10 | ⊚ | — | ○ | — | ○ |
|  | 50 | ⊚ | — | ○ | — | ○ |

From the above test results, it is clearly proved that the sealing member having a buffer layer relating to the invention has excellent sealing performance in comparison with the conventional sealing member.

At the sealing portion between the low melting point glass 13 and stainless steel piece 14, a particular difference in sealing performance is not shown between the sealing member relating to the invention and the conventional sealing member.

In actuality, an insulating package, in which a cap 10 made of stainless steel was adhered and sealed to an insulating base 15 having a bottom plate 1 and frame body 2 which were made of a glass ceramic compound by low melting point glass 9 via a buffer layer 16, was subjected to the same test, and similar results were obtained.

Also, as the alkali glass of a glass ceramic compound comprising the bottom plate 1 and frame body 2, in addition to the glass shown in the above embodiments, when glass having the abovementioned second or third composition was used, similar results were obtained.

Furthermore, when the alkali glass having any of the first through third compositions was used which was added with 1.2 through 5 wt % fine powder (particle diameter: 0.1 through 1 μm) of one or more selected among ZrO, SnO$_2$, P$_2$O$_5$, and MoO$_3$, similar results were obtained.

In the descriptions of the first and second embodiments, the quartz oscillator A or B having specific arrangement is described, however, the invention is not limited to these embodiments.

For example, in the quartz oscillators A and B, the supporting part 7 for supporting the quartz oscillating piece 8 is formed from the same material as that of the Ag/Pb electrodes 3 and 4, however, they can be formed from the same material as that of the bottom plate 1 and frame body 2. By such an arrangement, the amounts of the expensive conductive pastes such as the Ag paste and Ag/Pb paste used can be reduced, whereby the cost can also be reduced.

Also, the invention can be applied to a quartz oscillator having a structure so as to ground a metal cap 10. When the metal cap 10 is grounded, the change in characteristics of an element such as quartz oscillating piece 8 housed inside due to the floating capacity or external electromagnetic waves can be prevented. In this case, the metal cap 10 can be provided with legs for grounding, whereby the cap-can be directly grounded. Also, at the end faces of the low melting point glass 9, frame body 2, and bottom plate 1, a conductive layer of Ag/Pb or the like can be formed for grounding. Furthermore, low melting point glass containing dispersed conductive particles can be used as the low melting point glass 9, and a conductive layer of Ag/Pb or the like can be formed on the end faces of the frame body 2 and bottom plate 1 for grounding. In the second embodiment, if the buffer layer 16 of the invention is formed of a metallized layer or metal layer, this buffer layer 16 can be used for connection between the metal cap 10 and conductive layer for grounding.

Furthermore, in the first and second embodiments, as for the surface mounting type quartz oscillator, by particularly considering prevention of a change in characteristics due to a difference in thermal expansion coefficient and also reduction in height, the insulating base 15 and metal cap 10 which has a thermal expansion coefficient equal to or close to that of the quartz oscillating piece are used, however, if reduction in height is not greatly demanded, a ceramic-made cap or glass ceramic-made cap can be used. If the cap is made of ceramic or glass ceramic, needless to say, a buffer layer is also required to interpose between the low melting point glass and cap.

Still further, the invention can also be applied to a package of a glass ceramic compound for an elastic surface wave element, semiconductor device, or electronic parts. For the purpose of use other than the quartz oscillator, in accordance with the thermal expansion coefficient of the element to be housed inside, the thermal expansion coefficients of the insulating base 15, low melting point glass 9, and metal cap 10 may be properly adjusted. For adjusting the thermal expansion coefficient of the glass ceramic compound, the amount of the fine powder of forsterite to be dispersed in alkali glass may be properly adjusted. For adjusting the thermal expansion coefficient of the low melting point glass, the amount of a phosphoric acid compound or niobium pentoxide as a filler to be added and the amount of a solid solution of zirconium oxide and niobium oxide to be added may be properly adjusted. In all cases, by increasing the amount of fine powder of forsterite to be dispersed, the amount of phosphoric acid compound or niobium pentoxide to be added, and the amount of the solid solution of zirconium oxide and niobium oxide to be added, the thermal expansion coefficients are decreased. To the contrary, if these amounts to be added are reduced, the thermal expansion coefficients are increased.

Next, the third embodiment shall be described.

Figure 9:
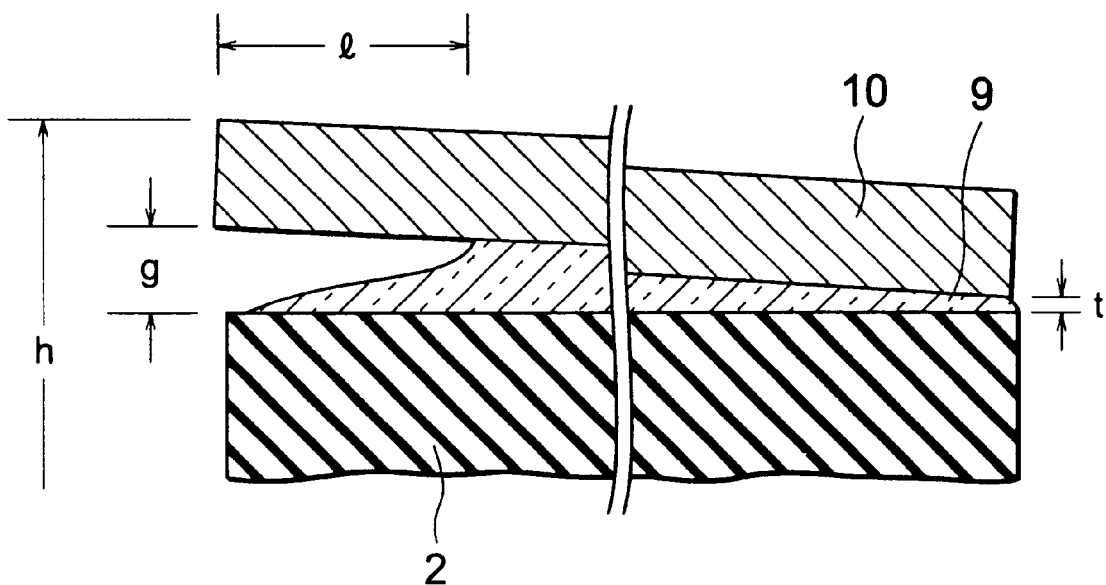
FIG. 9 is a sectional view showing the inclination of the cap.

In the first and second embodiments, between the frame body 2 and cap 10, low melting point glass 9 is interposed, however, in some cases, the thickness t of the low melting point glass 9 is difficult to control. For example, as shown in FIG. 9, if the cap 10 is inclined and sealed, in the section of one side (right half of the figure), the thickness t of the low melting point glass 9 is not sufficient, and sealing failure may be occur. On the other hand, in the section of the other side (left half of the figure), the dimension g of the space between the frame body 2 and cap 10 becomes larger, and the low melting point glass 9 may be insufficient. As a result, the low melting point glass 9 enter by a dimension of 1 further than the end portions of the frame body 2 and cap 10, and the sealing distance becomes insufficient, whereby sealing failure may be occur.

Also, such inclination of the cap 10 inevitably causes an increase in height h in the higher end portion of the cap 10 (left side of the figure). The increase in height h is not great as an absolute number, however, in the current status where the thickness of the entire insulating package has been reduced to approximately 1.0 mm, the increase in height cannot be relatively ignored. The third embodiment is to solve such a problem.

Figure 10A:
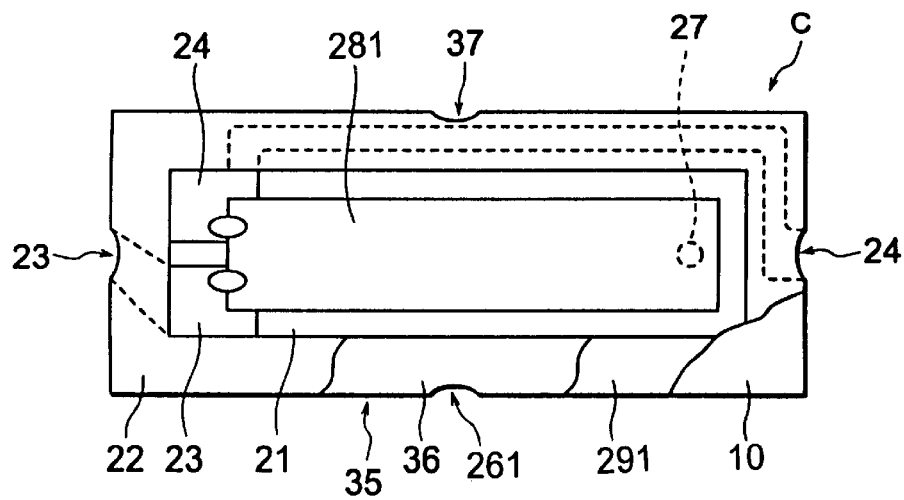
Figure 10B:
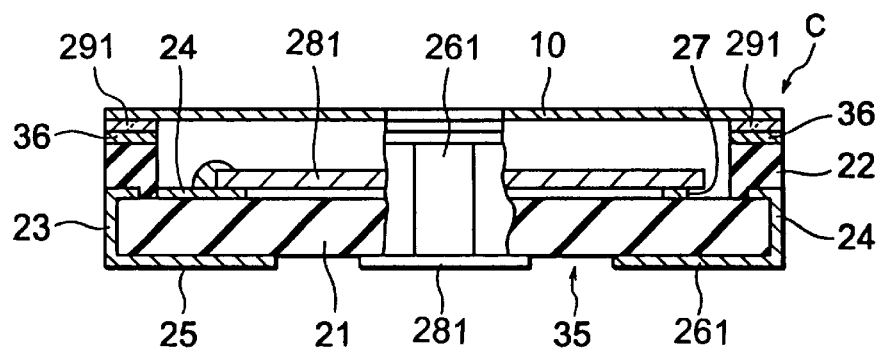
Figure 10C:
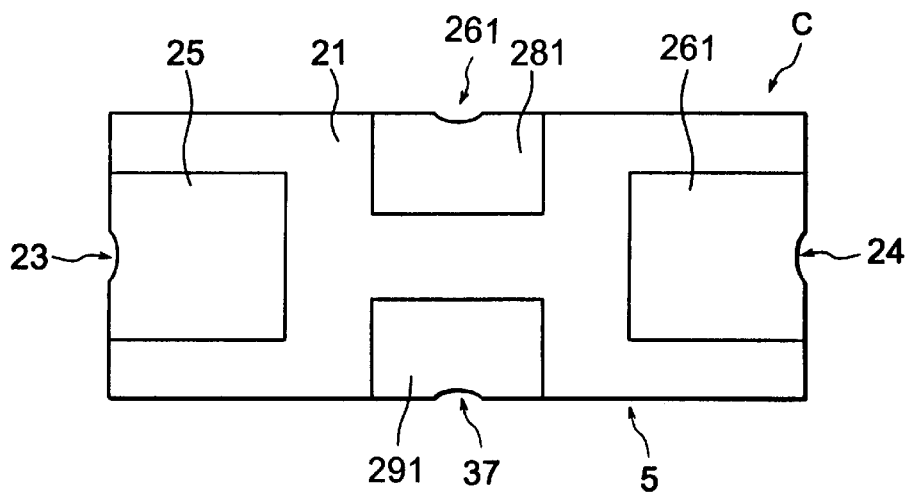

FIG. 10A through FIG. 10C show the surface mounting type quartz oscillator C relating to the embodiment of the invention, wherein FIG. 10A is a plan view partially cut and opened so as to show the internal structure, FIG. 10B is a schematic section along the center line in the length direction which partially includes a front view, and FIG. 10C is a lower view.

In the third embodiment, the bottom plate 21 and frame body 22, which are made of a glass ceramic compound, are formed and united to comprise the insulating base 35. The bottom plate 21 has the shape of a plate. The frame body 22 has the shape of a frame. The bottom plate 21 and frame body 22 are formed by molding and heating a green sheet in which 30 through 70 wt % fine powder of forsterite with particle diameters of approximately 0.3 through 3 $\mu$m is dispersed in fine powder of alkali glass with particle diameters of approximately 0.3 through 3 $\mu$m, for example. The fine powder of alkali glass comprising the glass ceramic compound for the bottom plate 21 and frame body 22 has the following composition, for example. The thermal expansion coefficients of the bottom plate 1 and frame body 2 are $100 \times 10^{-7}$ through $150 \times 10^{-7}$ (/° C.), for example.

$SiO_2$: 50 to 70 (wt %)

$Al_2O_3$: 2 to 15 (wt %)

RO: 5 to 30 (wt %) (R includes one or more among Ca, Sr, and Ba)

$B_2O_3$: 1 to 8 (wt %)

ZnO: 2 to 15 (wt %)

$R'_2O$: 5 to 30 (wt %) (R' includes one or more among Na, K, and Li)

At the upper surface of one end portion in the length direction of the bottom plate 21, as shown in FIG. 10A, an Ag/Pb paste is applied and sintered, whereby Ag/Pb electrodes 23 and 24 are formed. The Ag/Pb electrode 23, as shown in FIG. 10B, passes between the bottom plate 21 and frame body 22, and is led out from one end in the length direction of the bottom plate 21. The other Ag/Pb electrode 24, as shown in FIG. 10B, makes a detour below the frame body 22, and is led out from the other end of the bottom plate 21. Also, at both ends in the length direction of the lower surface of the bottom plate 21, Ag/Pb terminals 25 and 26 are formed. The Ag/Pb electrodes 23 and 24 pass the end face of the bottom plate 21, and are connected to the Ag/Pb terminals 25 and 26, respectively. On the Ag/Pb electrodes 23 and 24 and Ag/Pb terminals 25 and 26, for example, electroless Ni plating layers and/or electroless Au plating layers may be formed.

On the Ag/Pb electrodes 23 and 24, quartz oscillating piece 28 having electrodes (not shown) on both surfaces is adhered by a conductive adhesive, and the Ag/Pb electrodes 23 and 24 and quartz oscillating piece 28 are connected to each other.

Also, near the end portion of the upper surface of the bottom plate 21 at the opposite side of the Ag/Pb electrodes 23 and 24, supporting part 27 for supporting the quartz oscillating piece 28 in a horizontal condition is formed. The supporting part 27 is formed from the same material as that of the Ag/Pb electrodes 23 and 24 so as to have the same thickness. The supporting part 27 is sometimes called a "pillow". Also, since the supporting part 27 is provided for supporting the quartz oscillating piece 28 in a horizontal condition, it is not necessary to adhere the quartz oscillating piece 28 to the part.

At the upper surface of the frame body 22, by the metallizing method or by applying and sintering the Ag paste and Ag/Pb paste, conductive layer 36 for grounding is formed.

Also, at both end surfaces in the width directions of the bottom plate 21 and frame body 22, by the metallizing method or applying and sintering an Ag paste and Ag/Pb paste, conductive layers 261 and 37 for grounding are formed.

Furthermore, at both ends in the width direction of the back surface of the bottom plate 21, by applying and sintering an Ag paste and Ag/Pb paste, terminals 281 and 291 for grounding are formed.

Figure 11:
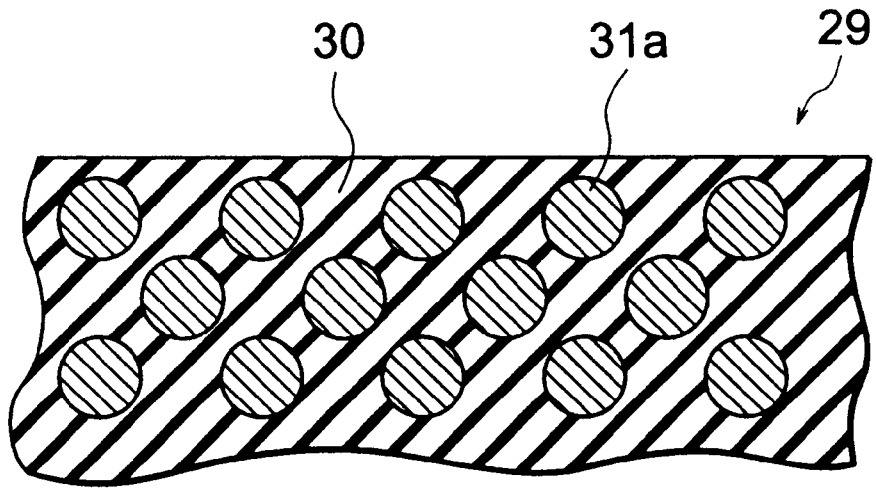
Figure 12:
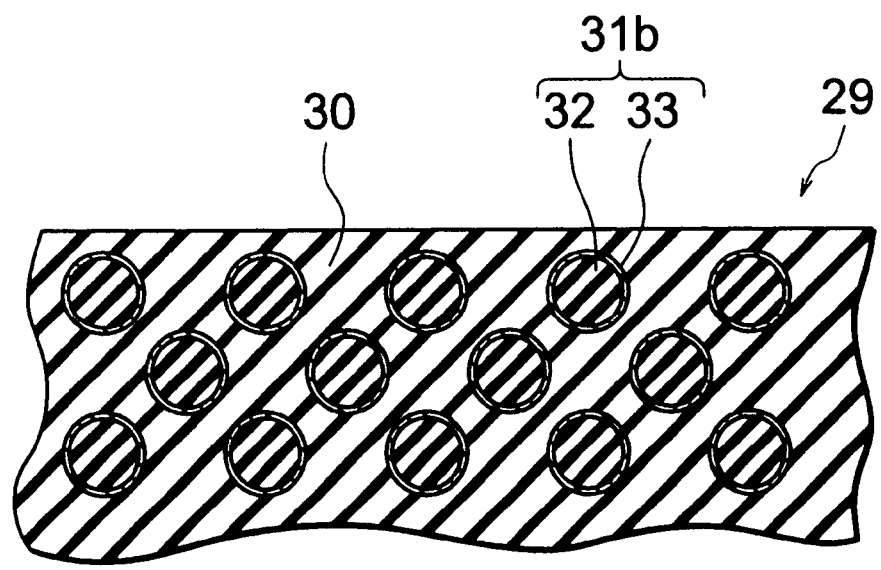
FIG. 12 is a sectional view showing the spherical particles 31b.

On the frame body 22, via the low melting point glass 29, metal cap 10 made of stainless steel is adhered. Thereby, the inside of the insulating package is sealed. The low melting point glass 29 is formed by applying and sintering low melting point glass paste 30 containing spherical particles 31a with diameters of 10 μm or more dispersed as shown in FIG. 11, for example. It is particularly preferable that the spherical particles 31a are entirely made of metal such as Cu and Ni or an alloy of Ag—Cu or Ag—Cd. And, as shown in FIG. 12, for example, the low melting point glass 29 is formed by applying and sintering low melting point glass paste 30 containing conductive spherical particles 31b dispersed. The spherical particles 31b are particles in which conductive layers 33 with thickness of approximately 0.1 through 10 μm made of the abovementioned metal or alloy are formed on the surfaces of spherical insulating particles 32 of ceramic or glass ceramic having particle diameters of 10 μm or more.

Figure 13A:
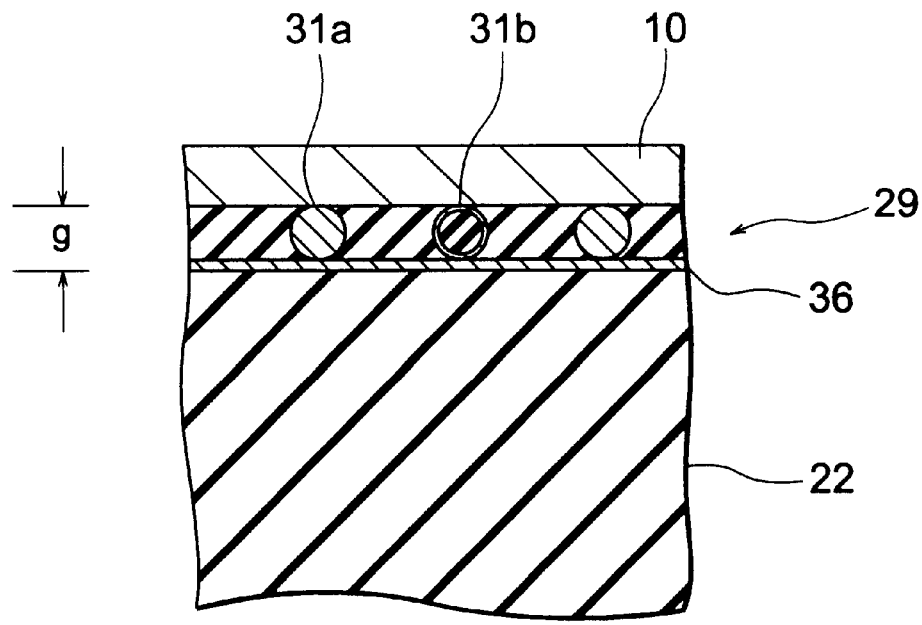
FIG. 13A and FIG. 13B are enlarged sections showing the sealing part by the low melting point glass 29 of the quartz oscillator C.
Figure 13B:
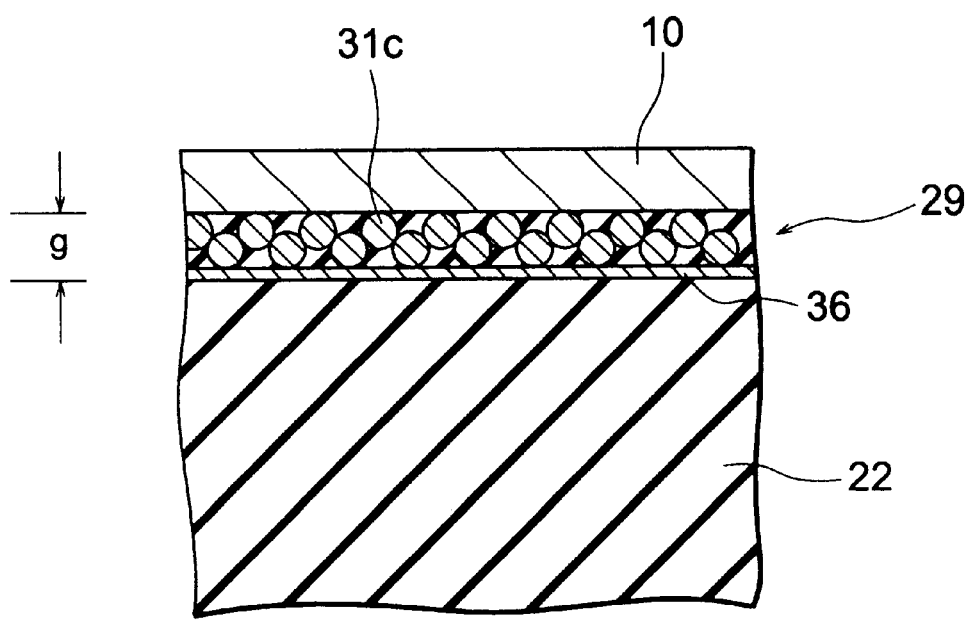

FIG. 13A and FIG. 13B are enlarged longitudinal sections showing the sealing portion of the quartz oscillator C by the low melting point glass 29. FIG. 13A shows the case where the space g to be controlled is substantially equal to the particle diameter of conductive spherical particles 31a and 31b, and FIG. 13B shows the case where the space g to be controlled is larger than the particle diameter of the conductive spherical particle 31c. The spherical particles 31c are formed by making the spherical particles 31a or spherical particles 31b smaller.

Herein, the particle diameters of the spherical particles 31a, 31b, and 31c are set in accordance with the thickness of the low melting point glass 29. The thinner the thickness of the low melting point glass 29, the more preferable for reduction in height, however, generally, the thickness is set to approximately 50 μm in order to allow for unevenness in flatness of the upper surface of the frame body 22 and metal cap 10. Therefore, in a case where the thickness of the low melting point glass 29 is set to 50 μm, the diameters of the conductive spherical particles 31a and 31b are also set to approximately 50 μm. On the other hand, when using the spherical particles 31c, the diameters thereof are set between 10 μm and 50 μm. This is because, if the diameters of the spherical particles 31c are less than 10 μm, contacts between spherical particles 31c become difficult, and also, it becomes difficult to make the thickness of the low melting point glass 29 even. In addition, conductivity of the low melting point glass 29 becomes difficult to secure, and the electrical connection between the conductive layer 36 for grounding formed on the upper surface of the frame body 22 and the metal cap 10 becomes difficult.

When the spherical particles 31a and 31b having thickness roughly equal to a desired thickness of the low melting point glass 29 are used, since the desired thickness of the low melting point glass 29 can be obtained by means of the spherical particles 31a and 31b, it is not necessary to greatly increase the amount of the particles to be dispersed. On the other hand, when the spherical particles 31c are used, in order to secure the contacts between the spherical particles 31c, it is desirable that the amount thereof to be dispersed is increased.

According to the quartz oscillator C, since the conductive spherical particles 31a, 31b, and 31c function as spacers, as shown in FIG. 13A and FIG. 13B, the space g between the conductive layer 36 and metal cap 10 formed on the upper surface of the frame body 22 can be easily made constant without fail. Therefore, sealing failure due to inclination of the metal cap 10 and increase in height of the entire package can be prevented.

Furthermore, as shown in FIG. 13A and FIG. 13B, the conductive layer 36 and metal cap 10 formed on the upper surface of the frame body 22 are electrically connected to each other by the spherical particles 31a, 31b, and 31c dispersed inside the low melting point glass 29, and the conductive layer 36 is connected to the terminals 281 and 291 via the conductive layers 261 and 37. That is, the metal cap 10 is connected to the terminals 281 and 291 via the conductive layer 36. Therefore, if the terminals 28 and 29 are connected to conductive land for grounding of the attaching plate of a print circuit board, the metal cap 10 can be grounded. Thus, by grounding the metal cap 10, the floating capacity is eliminated. Also, external electromagnetic waves are grounded through the metal cap 10, and prevented from harmfully influencing the quartz oscillating piece 28 housed inside.

Figure 14A:
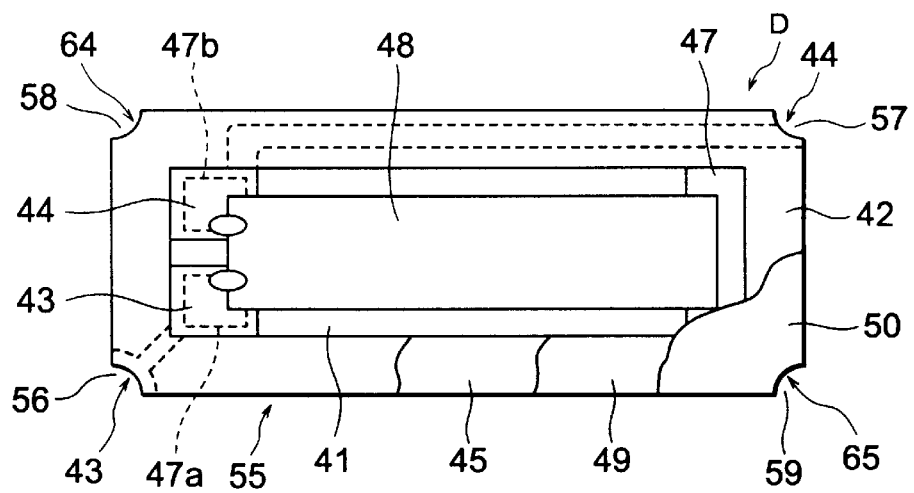
Figure 14B:
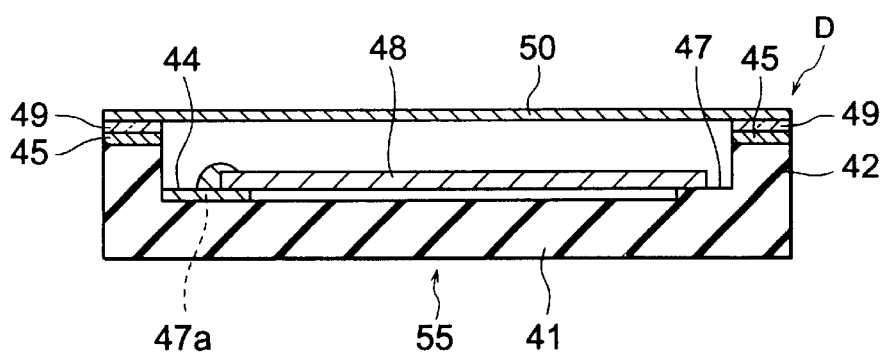
Figure 14C:
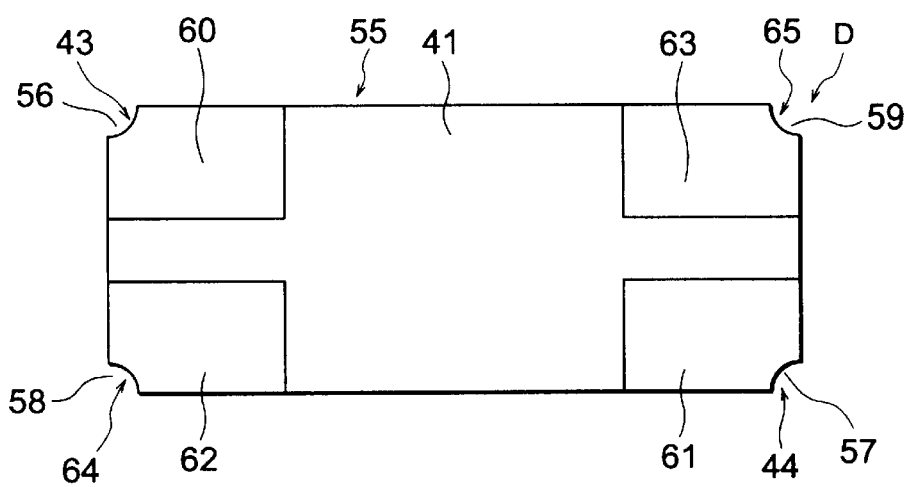

Next, the fourth embodiment shall be described. FIG. 14A through FIG. 14C show the surface mounting type quartz oscillator D relating to the embodiment of the invention, wherein FIG. 14A is a plan view partially cut and opened so as to show the internal structure, FIG. 14B is a schematic section along the center line in the length direction which partially includes a front view, and FIG. 14C is a lower view.

In the fourth embodiment, the bottom plate 41 and frame body 42 which are made of a glass ceramic compound are formed and united to comprise insulating base 55. The bottom plate 41 has the shape of a plate. The frame body 42 has the shape of a frame. However, unlike the quartz oscillator of the third embodiment, at the four corners of the insulating base 55, arc concave portions 56, 57, 58, and 59 are formed. Also, on the upper surface at one end in the length direction of the bottom plate 41, as shown in FIG. 14A, by applying and sintering an Ag/Pb paste, Ag/Pb electrodes 43 and 44 are formed. The Ag/Pb electrode 43, as shown in FIG. 14B, passes between the bottom plate 41 and frame body 42, and is led to the concave portion 56 at one side (lower left of FIG. 14A) of a pair of opposite corners. The other Ag/Pb electrode 56, as shown in FIG. 14B, makes a detour below the frame body 42, and is led to the concave portion 57 at the other side (upper right of FIG. 14A) of the abovementioned pair of opposite corners. Also, at the four corners of the lower surface of the bottom plate 41, Ag/Pb terminals 60, 61, 62, and 63 are formed. And, the Ag/Pb electrodes 43 and 44 are connected to the Ag/Pb terminals 60 and 61 by passing the concave portions 56 and 57 of the bottom plate 41, respectively.

At the positions of the electrodes 43 and 44 formed on the upper surface of the bottom plate 41, pedestals 47a and 47b made of the same material as that of the bottom plate 41 are formed. On the other hand, at the opposite end portion, supporting part 47 which is made form the same material as that of the pedestals 47a and 47b and has the same height is formed. Also, at the end faces of the concave portions 58 and 59, by applying and sintering an Ag paste and Ag/Pb paste, conductive layers 64 and 65 for grounding are formed, respectively. The conductive layers 64 and 65 are connected to the terminals 62 and 63, respectively. Furthermore, on the upper surface of the frame body 22, by applying and sintering an Ag paste and Ag/Pb paste, conductive layer 45 for grounding is formed.

Quartz oscillating piece 48, low melting point glass 49, and metal cap 50 made of stainless steel are the same as those of the quartz oscillator C of the third embodiment.

According to the quartz oscillator D, since conductive spherical particles in the low melting point glass 49 function as spacers, the space between the conductive layer 45 and metal cap 50 which are formed on the upper surface of the frame body 42 can be easily made constant without fail. Therefore, sealing failure and an increase in height in the entire package due to an inclination of the metal cap 50 can be prevented. Also, the conductive layer 45 is connected to the terminals 62 and 63 via the conductive layers 64 and 65. That is, the metal cap 50 is connected to the terminals 62 and 63 via the conductive layers 45, 64, and 65. Therefore, the change in characteristics of the quartz oscillating piece 48 due to the floating capacity and external electromagnetic waves can be prevented.

Furthermore, in comparison with the third embodiment, since the arc concave portions 56 through 59 are formed at the four corners of the insulating base 55, the corners are structurally hard to chip. Also, the dimension of the detour of the electrode 44 decreases, and accordingly, the amounts of the expensive Ag paste and Ag/Pb paste to be used can be reduced. Therefore, the cost can be reduced. Moreover, since spaces for securing free vibration of the quartz oscillating piece 48 exist by means of the pedestals 47a and 47b, and the electrodes 43 and 44 are formed so as to cover the space, the thickness of the electrodes 43 and 44 can be made thinner than that of the prior-art. Accordingly, the amounts of the expensive Ag paste and Ag/Pb paste to be used can be reduced, and the cost can also be reduced. Also, since the entire supporting part 47 is formed from the same material as that of the bottom plate 41, the amounts of the expensive Ag paste and Ag/Pb paste to be used can be reduced further, and therefore, the cost is also reduced further.

In the descriptions of the third and fourth embodiments, the quartz oscillators C and D having specific arrangements are described, however, the invention is not limited to these.

For example, without forming the entire supporting part 47, pedestals similar to the pedestals 47a and 47b can be formed.

Also, the invention can be applied to an insulating package for housing various elements such as an elastic surface wave element, semiconductor device, and electronic element in addition to the quartz oscillator. The third and fourth embodiments relate to the quartz oscillators C and D, wherein the insulating base is made of a glass ceramic compound having a thermal expansion coefficient corresponding to that of the quartz oscillating piece, however, for other purposes of use, it can be made of ceramic, for example. In this case, the terminals at the lower surface of the bottom plate can be formed by applying and sintering a W paste and Mo paste.

Furthermore, in the abovementioned embodiments, the metal caps 10 and 50 are grounded, however, if there is no need to ground them, the conductive layers 36, 45, 261, 37, 56, and 57 and terminals 281, 291, 60, and 61 can be omitted. Also, the spherical particles may not be conductive.

Next, the fifth embodiment of the invention shall be described.

In the third and fourth embodiments, by grounding the metal caps, the change in characteristics due to the floating capacity and external electromagnetic waves is prevented, however, when the metal caps are made of stainless steel whose thermal expansion coefficient is close to that of the quartz oscillating piece, since resistance of the stainless steel-made caps is low, ground resistance thereof is high, and a sufficient grounding effect may not be obtained. That is, an effect that the change in characteristics of the quartz oscillating piece due to the floating capacity and external electromagnetic waves is prevented may be insufficient. The fifth embodiment is to solve such a problems.

Figure 15A:
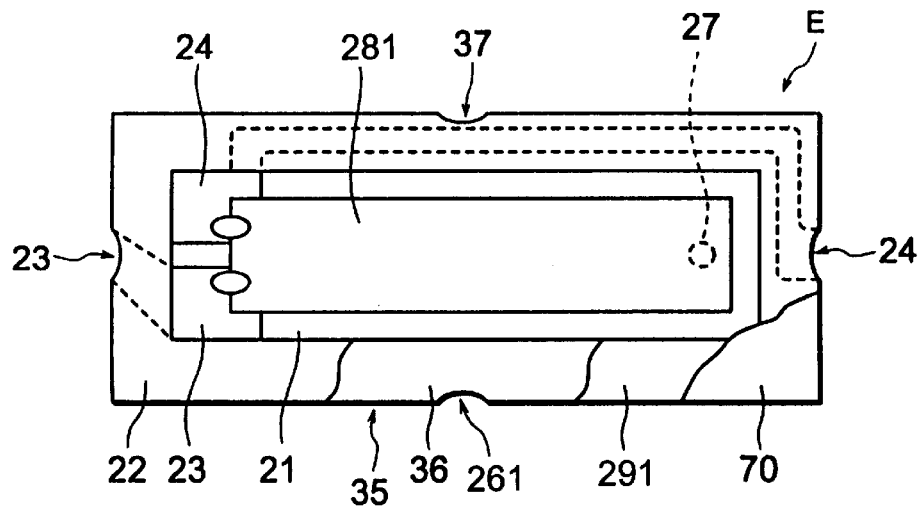
Figure 15B:
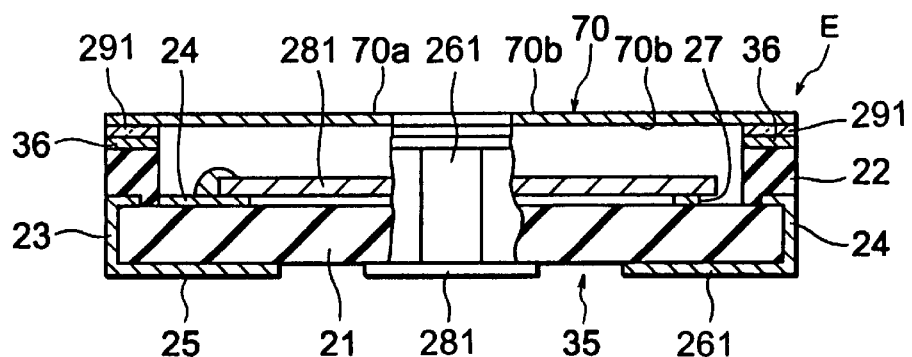
Figure 15C:
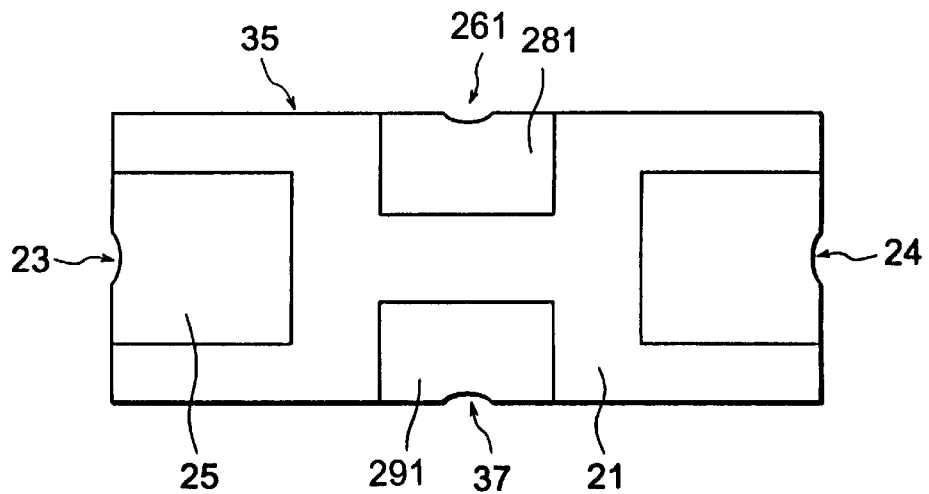

FIG. 15A through FIG. 15C show the surface mounting type quartz oscillator E relating to the embodiment of the invention, wherein FIG. 15A is a plan view partially cut and opened so as to show the internal structure, FIG. 15B is a schematic section along the center line in the length direction which partially includes a front view, and FIG. 15C is a lower view.

In the fifth embodiment, the structure of the cap is different from that of the third embodiment. That is, although the metal cap 10 made of stainless steel is used in the third embodiment, in the fifth embodiment, conductive cap 70 as described below is used.

Figure 16A:
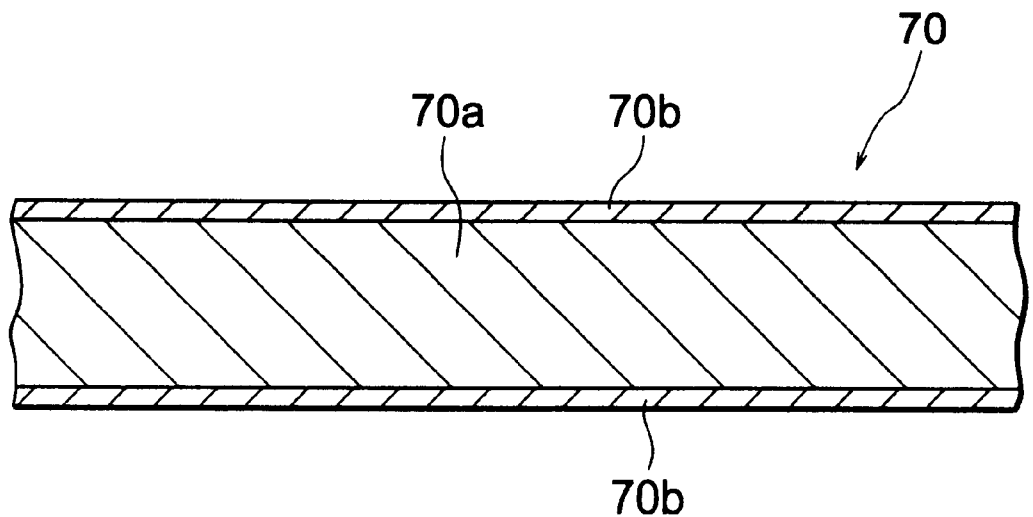
FIG. 16A and FIG. 16B are sectional views showing the electric conductive cap.
Figure 16B:
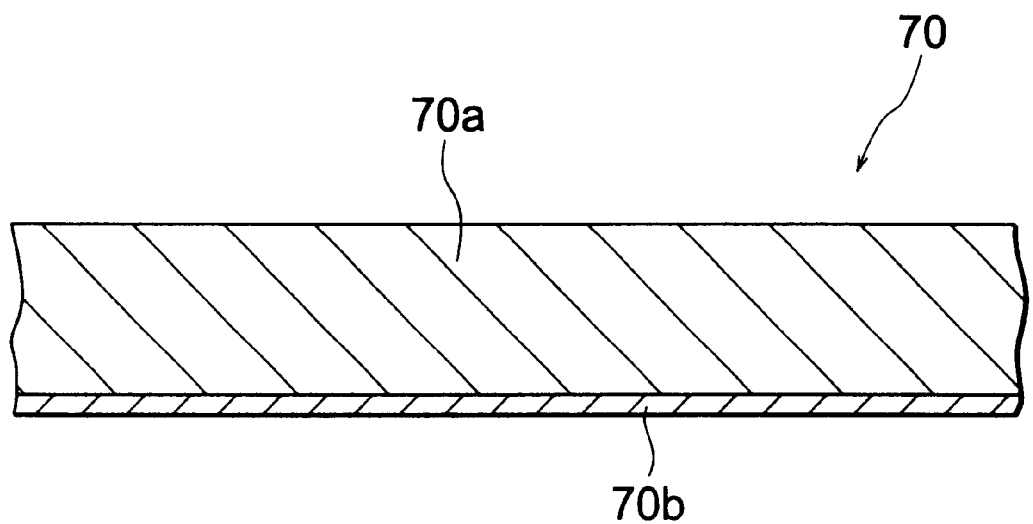

In the conductive cap 70, as shown in FIG. 16A, on both surfaces of cap core 70a made of stainless steel, conductive films 70b formed of any or a laminated film of an Ag film, Au film, Cu film and Ni film. The thermal expansion coefficient of the cap core 70a is $100 \times 10^{-7}$ through $150 \times 10^{-7}$ (/° C.), for example. Also, the thickness of the conductive films 70b are 0.1 through 50 μm, for example. The conductive films 70b can be formed by means of the plating method, printing method, vapor deposition method, sputtering method, or cladding method, for example. Herein, forming of the conductive films 70b of the abovementioned material films is in order to make the resistance of the conductive films 70b lower than that of the cap body 70a made of stainless steel. Also, if the thickness of the conductive film 70b is less than 0.1 μm, an effect for reducing resistance is hardly obtained. In a case where the thickness of the conductive films 70b are more than 50 μm, not only the cost increases, but also reduction in height of the insulating package becomes difficult. Therefore, the thickness of the conductive films 70b are desirably 0.1 through 50 μm. Forming of the conductive films 70b on both surfaces of the cap core 70a is in order to eliminate the necessity of distinguishing the surface and back of the conductive cap 70 when it is sealed to the frame body 22.

According to the quartz oscillator E relating to the fifth embodiment, even if the cap core 70a of the conductive cap 70 is made of stainless steel, by the conductive films 70b existing at the lower surface, the ground resistance becomes low, for example, 1 Ω or less. Therefore, not only harmful floating capacity is eliminated, but also external electromagnetic waves are grounded from the conductive cap 70 without fail to be prevented from harmfully influencing the quartz oscillating piece 28 housed inside without fail.

Figure 17A:
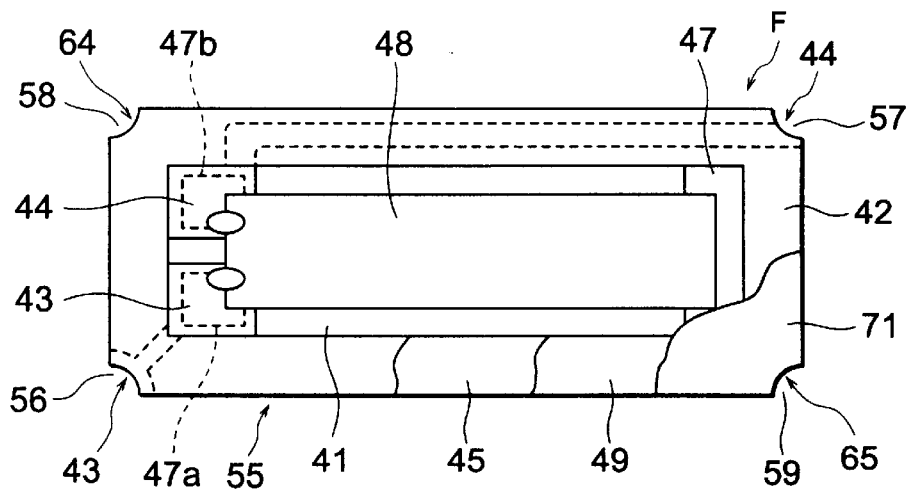
Figure 17B:
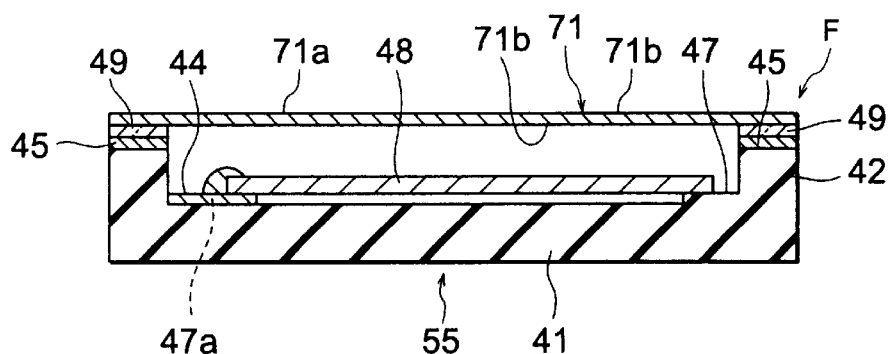
Figure 17C:
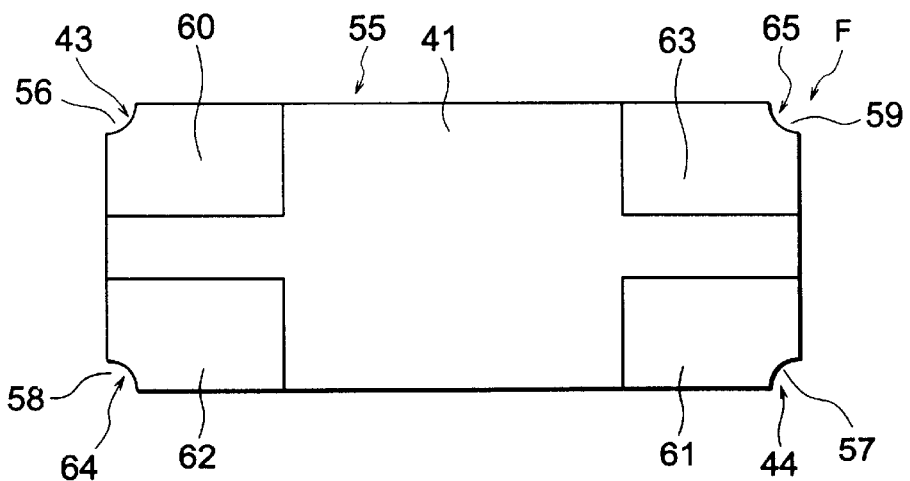

Next, the sixth embodiment shall be described. In the sixth embodiment, the structure of the cap is different from that of the fourth embodiment. FIG. 17A through FIG. 17C show the surface mounting type quartz oscillator F relating to the embodiment of the invention, wherein FIG. 17A is a plan view cut and opened so as to show the internal structure, FIG. 17B is a schematic section along the center line in the length direction which partially includes a front view, and FIG. 17C is a lower view. That is, in the fourth embodiment, the metal cap 50 made of stainless steel is used, however, in the sixth embodiment, conductive cap 71 having the same layer composition as that of the fifth embodiment is used.

In the conductive cap 71, at both surfaces of cap core 71a made of stainless steel, conductive films 71b formed of any or laminated film of an Ag film, Au film, Cu film, and Ni film are formed. The thermal expansion coefficient of the cap core 71a is $100 \times 10^{-7}$ through $150 \times 10^{-7}$ (/° C.), for example. The thickness of the conductive films 71b are 0.1 through 50 $\mu$m, for example. The conductive films 71b can be formed by means of the plating method, printing method, vapor deposition method, sputtering method, or cladding method, for example.

Therefore, by the sixth embodiment, both of the effects of the fourth embodiment and the effects of the fifth embodiment can be obtained.

Next, the quartz oscillator F relating to the sixth embodiment described below was actually manufactured, and the results of measurement of the ground resistance of the vibrator shall be described.

Insulating base 55
Material: glass ceramic compound
Dimensions: length: 6 mm, width: 3.5 mm, height: 0.6 mm
Terminals 62 and 63 for grounding
Material: Ag/Pb
Thickness: 10 to 30 ($\mu$m)
Dimensions: length: 1.5 mm, width: 1.0 mm
Conductive layers 43, 44, 45 for grounding
Material: Ag/Pb
Thickness: 10 to 30 ($\mu$m)
Conductive glass (low melting point glass) 49
Glass material: silver-phosphoric acid glass
Conductive particles: Ag fine particles, Au plating resin balls
Conductive particle diameter: 0.003 to 100 ($\mu$m)
Amount of conductive particles to be added: 1 to 8 capacity % (in the form of low melting point glass powder)
Thickness: 50 to 150 ($\mu$m)
Conductive cap 71
Conductive cap core 70a
  Material: stainless steel
  Specific resistance: 70 ($\mu\Omega$·cm)
  Dimensions: length: 5.7 mm, width: 3.1 mm,
thickness: 0.1 mm
Conductive films 70b
  Material: 1 to 4, ($\mu$m) electric Ag plating on 0.1 to 1 ($\mu$m) electric Ni plating As for 100 insulating packages having the abovementioned arrangement, ground resistance between the cap cores 70a and terminals 62 and 63 for grounding was 0.15 through 0.25 $\Omega$ (average: 0.2 $\Omega$).

On the other hand, as for 100 insulating packages having the abovementioned arrangement with the exception that the conductive films 70b are not provided as comparative examples, the ground resistance was 25 through 100 $\Omega$ (average: 50 $\Omega$).

From these results, it is clearly understood that the ground resistance of the insulating package relating to the invention is extremely small.

Also, in the fifth and sixth embodiments relating to the quartz oscillators E and F, the insulating base comprised of the bottom plate and frame body is made of a glass ceramic compound whose thermal expansion coefficient ($100 \times 10^{-7}$ through $150 \times 10^{-7}$ (/° C.)) is equal to or close to that of the quartz oscillating piece ($130 \times 10^{-7}$ (/° C.)), however, for other purposes of use, the insulating base can be formed from ceramic of alumina, forsterite, steatite, magnesia, and zirconia.

Likewise, although the cap core of the conductive cap is made of stainless steel whose thermal expansion coefficient ($100 \times 10^{-7}$ through $150 \times 10^{-7}$ (/° C.)) is equal to or close to that of the quartz oscillating piece ($130 \times 10^{-7}$ (/° C.)), it can, however, be made of iron-based alloy, iron-nickel alloy, and an iron-nickel-cobalt alloy called Kovar (trademark). Furthermore, for a purpose in which reduction in height is not greatly demanded, it can be made of conductive ceramic.

Also, onto the surfaces of the electrodes, terminals, and conductive layers, for the purpose for guaranteeing solder wetness after storage for a long period of time, Ni plating and Au plating can be applied.

Furthermore, the abovementioned embodiments can be properly combined.

What is claimed is:

1. Silver-phosphoric acid-based low melting point glass:

containing at least one kind of substance selected from a group consisting of Al, Ni, Ag, $BaTiO_3$, NiCr, TiB, and $TiO_2$.

2. The silver-phosphoric acid-based low melting point glass as set forth in claim 1, wherein the content of said substance(s) is 0.1 through 10 vol % in total.

3. A glass ceramic sealing member comprising:

a base member made of a glass ceramic compound; and silver-phosphoric acid-based low melting point glass to be used to seal said base member which contains at least one kind of substance selected from a group consisting of Al, Ni, Ag, $BaTiO_3$, NiCr, TiB, and $TiO_2$.

4. The glass ceramic sealing member as set forth in claim 3, wherein the content of said substance(s) is 0.1 through 10 vol % in total.

5. The glass ceramic sealing member as set forth in claim 3, wherein said base member contains glass of a composition consisting of $SiO_2$ of 50 through 70 wt %, $Al_2O_3$ of 2 through 15 wt %, RO of 5 through 30 wt % (R contains one or more of Ca, Sr, and Ba), $B_2O_3$ of 1 through 8 wt %, ZnO of 2 through 15 wt %, and $R'_2O$ of 5 through 30 wt % (R' contains one or more of Na, K, and Li), and fine powder of forsterite dispersed in said glass.

6. The glass ceramic sealing member as set forth in claim 5, wherein the content of said substance(s) is 0.1 through 10 vol % in total.

7. A sealing member comprising:

a base member made of a glass ceramic compound;

a silver-phosphoric acid-based low melting point glass to be used to seal said base member; and a buffer layer interposed between said base member and said low melting point glass.

8. The sealing member as set forth in claim 7, wherein said base member is contains alkali glass ingredients.

9. The sealing member as set forth in claim 8, wherein said base member has forsterite dispersed in alkali glass.

10. The sealing member as set forth in claim 9, wherein the content of said forsterite is 30 through 70 wt %.

11. A sealing member as set forth in claim 10, wherein said alkali glass of said base member has a composition consisting of $SiO_2$ of 50 through 70 wt %, $Al_2O_3$ of 2 through 15 wt %, RO of 5 through 30 wt % (R contains one or more of Ca, Sr, and Ba), $B_2O_3$ of 1 through 8 wt %, ZnO of 2 through 15 wt %, and $R'_2O$ of 5 through 30 wt % (R' contains one or more of Na, K, and Li).

12. The sealing member as set forth in claim 8, wherein said silver-phosphoric acid-based low melting point glass is Ag—I—P—O—based and silver-phosphoric acid-based glass.

13. The sealing member as set forth in claim 7, wherein said glass ceramic compound forms an insulating base having a bottom plate and frame body, and said sealing member forms an insulating package having a metal cap adhered via said low melting point glass.

* * * * *